(12) United States Patent
Kanaya et al.

(10) Patent No.: US 6,217,158 B1
(45) Date of Patent: *Apr. 17, 2001

(54) LAYERED TYPE INK JET RECORDING HEAD WITH IMPROVED PIEZOELECTRIC ACTUATOR UNIT

(75) Inventors: Munehide Kanaya; Minoru Usui, both of Nagano (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/843,002

(22) Filed: Apr. 11, 1997

(30) Foreign Application Priority Data

Apr. 11, 1996 (JP) .................................................. 8-114136
May 21, 1996 (JP) .................................................. 8-150073
Aug. 12, 1996 (JP) .................................................. 8-229334

(51) Int. Cl.[7] .................................................. B41J 2/045
(52) U.S. Cl. .................................................. 347/70
(58) Field of Search .................................. 347/68, 70, 71; 310/330, 331, 332, 334, 335, 800

(56) References Cited

U.S. PATENT DOCUMENTS

| | | | |
|---|---|---|---|
| 4,358,781 | * 11/1982 | Yamamori et al. | 347/68 X |
| 4,383,264 | * 5/1983 | Lewis | 347/68 |
| 4,588,998 | 5/1986 | Yamamuro et al. | 347/68 |
| 4,742,365 | * 5/1988 | Bartky et al. | 347/71 |
| 4,766,671 | * 8/1988 | Utsumi et al. | 347/71 X |
| 4,825,227 | 4/1989 | Fischbeck et al. | 347/69 |
| 5,266,964 | 11/1993 | Takahashi et al. | 347/72 |
| 5,495,137 | 2/1996 | Park et al. | 310/331 |
| 5,812,163 | * 9/1998 | Wong | 347/68 |
| 5,856,837 | * 1/1999 | Kitahara et al. | 347/71 |

FOREIGN PATENT DOCUMENTS

| | | | |
|---|---|---|---|
| 58-7364 | 1/1983 | (JP) | B41J/3/04 |
| 62-101455 | 5/1987 | (JP) | B41J/3/04 |
| 5-261921 | 10/1993 | (JP) | B41J/2/045 |
| 6-40030 | 2/1994 | (JP) | B41J/2/045 |

* cited by examiner

Primary Examiner—Benjamin R. Fuller
Assistant Examiner—C. Dickens
(74) Attorney, Agent, or Firm—Sughrue, Mion, Zinn, Macpeak & Seas, PLLC

(57) ABSTRACT

The present invention is directed to a piezoelectric vibrator unit including an elastic plate made of piezoelectric material having at least one curved portion. The piezoelectric vibrator unit also includes at least one common electrode and a discrete electrode which are formed on opposite sides of the elastic plate. The application of an electric field applied between the electrodes 3 and 4 causes the extension or contraction of the curved portion of the plate.

20 Claims, 23 Drawing Sheets

LAYERED TYPE INK JET RECORDING HEAD WITH IMPROVED PIEZOELECTRIC ACTUATOR UNIT

BACKGROUND OF THE INVENTION

1. Field of the Invention

The present invention relates to a piezoelectric vibrator unit suitable for an ink jet recording head and an ink jet recording head using the piezoelectric vibrator unit. In particular, the present invention relates to a piezoelectric vibrator unit having curved portions which correspond to deformable regions of the vibrator unit.

2. Description of the Related Art

An actuator unit in which minute regions (arrayed at fixed pitches) are deflected is disclosed in Japanese Patent Laid-Open Publication No. Sho. 58-7364. The actuator unit includes a lower electrode, formed on the surface of a thin plate, which is elastically deformable. A green sheet, which is shaped like a rectangular strip and made of piezoelectric material, is layered on the thin plate surface with the lower electrode by bonding or coating. The resultant structure is sintered to form a piezoelectric layer. In addition, upper electrodes are formed on the surface of the sintered structure.

However, the bonding or coating process, by which the rectangular green sheet made of piezoelectric material is layered on the thin plate's surface is an essential step in the manufacture of the above-mentioned actuator unit. Therefore, the manufacturing of the actuator unit is inefficient. Furthermore, the lower electrode is easily peeled away from the piezoelectric layer in the sintering process. In this respect, the actuator unit is poor in durability.

To cope with this, a unique actuator unit is proposed in Japanese Patent Laid-Open Publication No. Sho. 62-101455. The actuator unit includes a thin elastic plate made of ceramic which has an electromechanical displacing property. A ceramic piece is inserted in a region of the elastic plate which is to be deflected. In addition, electrodes are attached to both sides of the region containing the ceramic piece.

The actuator unit described above eliminates the need for the bonding or coating process associated with the green sheet of piezoelectric material. In addition, the piezoelectric member has a single layer structure. Therefore, it rarely happens that the electrode is peeled away. However, the actuator unit has the following disadvantage. An elasticity and a rigidity of a vibrating region of the elastic plate are substantially equal to those in a non-vibrating region. Therefore, a displacement of the vibrated region by its deflection is small. Accordingly, when the actuator unit is applied to an ink jet recording head in which the volume of the pressure generating chamber is varied in order to discharge an ink droplet, a high voltage is required in order to drive the recording head.

SUMMARY OF THE INVENTION

In view of the foregoing, it is an object of the present invention to provide a piezoelectric vibrator unit having a single layer structure that allows for a greater displacement of the vibrating plate. Advantageously, the piezoelectric vibrator unit may be manufactured without any bonding or coating process for forming a piezoelectric member.

Another object of the present invention is to provide a method of manufacturing the piezoelectric vibrator unit.

Still another object of the present invention is to provide an ink jet recording head using the piezoelectric vibrator unit.

In order to carry out the above and other objects of the invention, a piezoelectric vibrator unit is provided in accordance with a first embodiment of the present invention. The piezoelectric vibrator unit includes an elastically deformable plate made of piezoelectric material having curved positions lengthwise arrayed at fixed pitches. A common electrode is formed on one side of the elastic plate, while discrete electrodes are formed on the curved portions of the elastic plate.

An extension and a contraction of the elastic plate are converted into deflection displacements that are made in conformity with a shape of each curved portion. Advantageously, the piezoelectric vibrator unit may be included in an ink jet recording head in which a pressure generating chamber is included. A rate of change of the volume of the pressure generating chamber per unit drive voltage is increased by employing the above mentioned elastically deformable plate having the curved portions instead of a vibrator unit including a flat plate.

BRIEF DESCRIPTION OF THE DRAWINGS

These and other features, aspects and advantages of the present invention will become better understood with reference to the following description, appended claims, and accompanying drawings, in which:

FIG. 1(a) is a cross-sectional view showing the piezoelectric vibrator unit when a drive signal is not applied thereto.

FIG. 1(b) is a cross-sectional view showing the piezoelectric vibrator unit when a drive signal is applied between one discrete electrode and a common electrode in the vibrator unit.

DETAILED DESCRIPTION OF THE PREFERRED EMBODIMENTS

The preferred embodiments of the present invention, which are illustrated in detail in the accompanying drawings, will be described hereunder.

Figure 1:
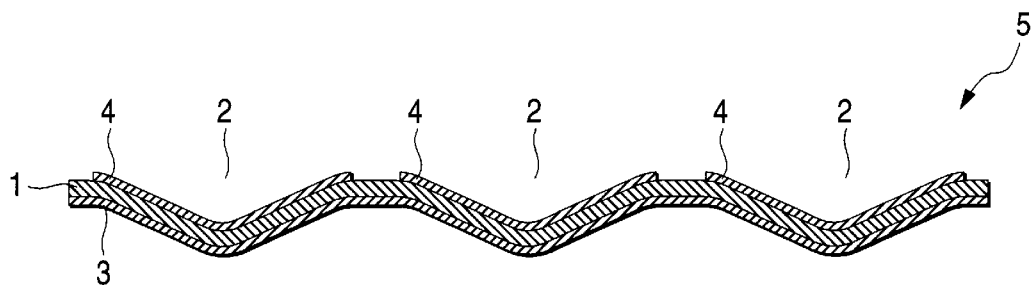
FIGS. 1(a) and 1(b) are cross-sectional views showing a piezoelectric vibrator unit according to an embodiment of the present invention.
Figure 1:
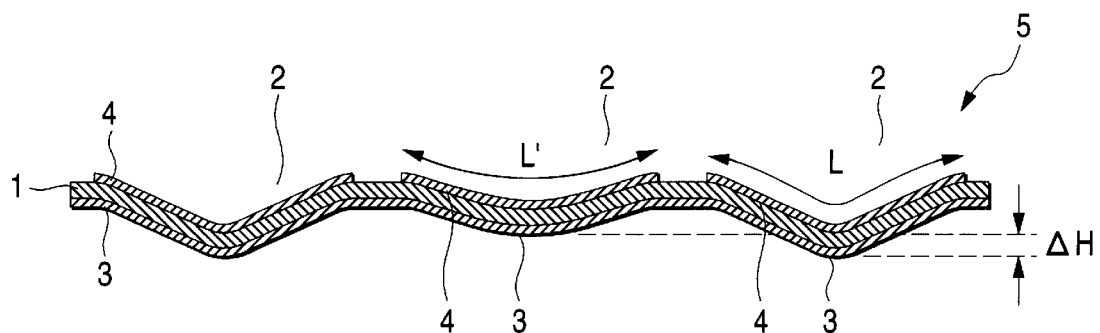

FIG. 1 is a cross-sectional view showing a piezoelectric vibrator unit 5 according to an embodiment of the present piezoelectric invention. The vibrator unit 5 includes an elastically deformable plate 1, made of piezoelectric material, e.g., PZT. By way of example, the plate 1 may be about 7 $\mu$m thick. The elastic plate 1 has a surface including troughs or curved portions 2 which are laterally spaced at fixed pitches. A common electrode 3 is layered over one side of the elastic plate 1.

To form the common electrode 3, platinum is vapor deposited over one side of the elastic plate 1. Alternatively, one side of the elastic plate may be coated with a conductive material which forms the common electrode 3. Discrete electrodes 4 are layered on the other side of the elastic plate 1 over the curved portions 2 that serve as deformable regions. The discrete electrodes 4 may be formed by vapor depositing platinum or the like over the surfaces of the curved portions 1. Alternatively, the surface of the curved portions 2 of the elastic plate 1 may be coated with conductive material which forms the discrete electrodes 4.

In the above-mentioned embodiment, a drive voltage is applied between the common electrodes 3 and at least one of the discrete electrodes 4. Thus, only the deformable region of the elastic plate 1, which is sandwiched between those electrodes 3 and 4, contracts, so that the corresponding curved portion 2 is displaced outwardly (upwardly in the drawing), as shown in FIG. 1(b). Specifically, the length L of the deformable region of the elastic plate 1 is increased to the length L' when the side edges of the deformable region are held by the corresponding side edges of one of the discrete electrodes 4. As a result, a tension is generated in the deformable region. To balance the tension, the deformable region varies its curvature. Consequently, the curved portion 2 moves upwards and reduces its depth by $\Delta H$.

In this state, an electric charge of the deformable region defined by the electrodes 3 and 4 is discharged so that the deformable region is restored to its original shape (i.e., the original shape of the curved portion 2), as shown in FIG. 1(a). Thus, the deformable regions of the elastic plate 1 of the single layer structure, which are defined by the discrete electrodes, may be selectively deformed when a drive signal is applied between the common electrode 3 and at least one of the discrete electrodes 4 which defines that region.

In the above-mentioned piezoelectric vibrator unit, a magnitude of deflection of the elastic plate 1 is maximized when a magnitude of deflection $\Delta H$ of the deformable region of the elastic plate 1 is selected to be one to two times as large as the thickness of the elastic plate 1.

Figure 2:
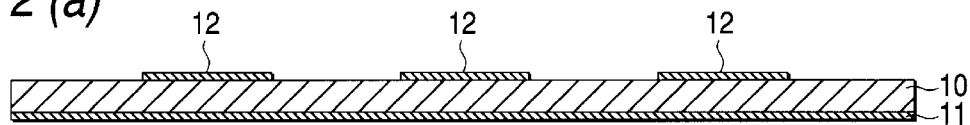
FIGS. 2(a) to 2(d) are sectional views showing a sequence of process steps of a method of manufacturing a piezoelectric vibrator unit according to another embodiment of the present invention.
Figure 2:
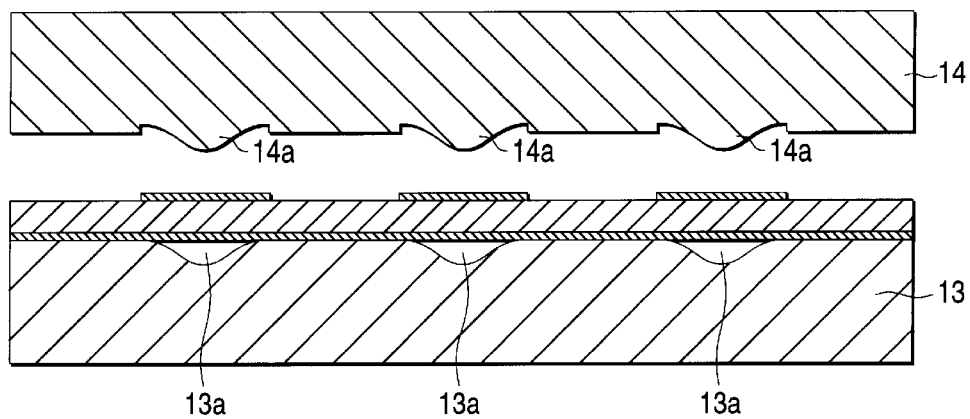
Figure 2:
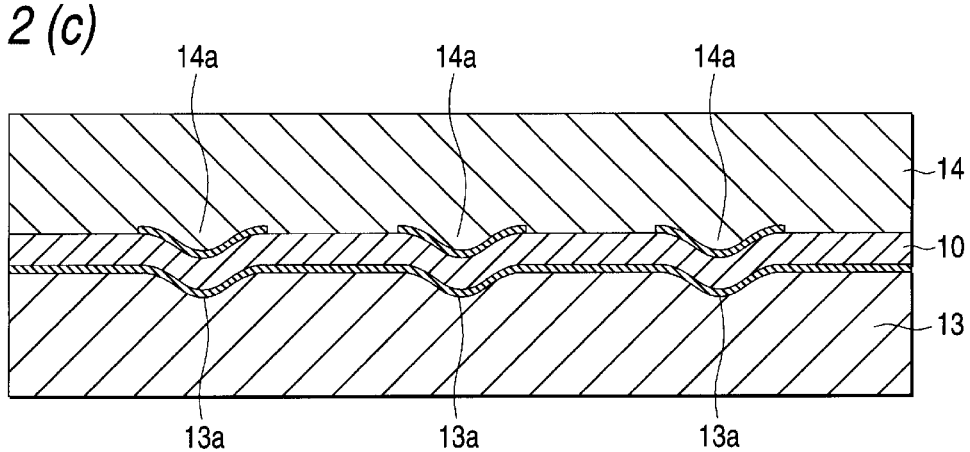
Figure 2:
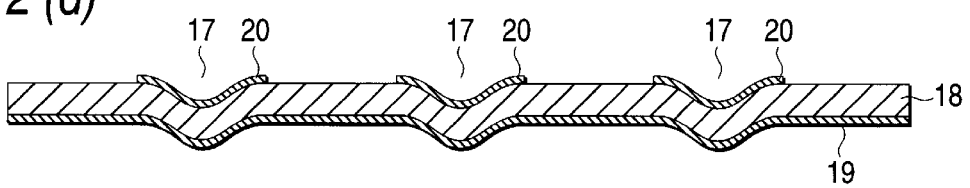

FIGS. 2(a)–2(d) show a sequence of process steps of a method of manufacturing the piezoelectric vibrator unit according to the present invention. A common electrode 11 is formed on one side of a green sheet 10 and discrete electrodes 12 are formed on the other side thereof. The green sheet 10 is made of piezoelectric material, e.g., PZT. The common electrode 11 consists of a deformable layer, made of a conductive material, formed by coating, as shown in FIG. 2a.

The green sheet 10 is then placed between a lower mold 13 and an upper mold 14, as shown in FIG. 2(b). In this case, the discrete electrodes 12 on the green sheet 10 are confronted with inwardly curved portions 13a of the lower mold 13, which are configured in conformity with the above-mentioned curved portions. The upper mold 14 having outwardly curved portions 14a is positioned so that the outwardly curved portions 14a thereof are confronted with the discrete electrodes 12 of the green sheet 10. The green sheet 10 is then pressed between the upper and lower molds 13 and 14 by applying a fixed pressure to the upper mold 14. As a result, the green sheet 10 and the electrodes 11 and 12 are configured as defined by the shapes of the upper and the lower molds 13 and 14, as shown in FIG. 2(c).

After the green sheet 10 is taken out of the lower and upper molds 13 and 14, or while the green sheet 10 is kept to be placed between the molds 13 and 14 under a fixed pressure, the green sheet 10 is sintered at a temperature, e.g., 1200° C., which is sufficient to transform its nature into a ceramic. In this way, a piezoelectric vibrator unit is manufactured.

The resulting piezoelectric vibrator unit consists of an elastic plate 18 having curved portions 17 configured as defined by the inwardly and outwardly curved portions 13a and 14a of the molds 13 and 14, a common electrode 19 layered on one side of the elastic plate 18, and drive (i.e., discrete) electrodes 20 formed and discretely arrayed on the other side thereof, as shown in FIG. 2(d).

In the manufacturing process mentioned above, the common electrode 19 and the discrete electrodes 20 are attached to the green sheet 18 before the green sheet 18 is subjected to the above process.

Figure 3:
FIGS. 3(a) to 3(e) are sectional views showing a sequence of process steps of a method of manufacturing a piezoelectric vibrator unit according to yet another embodiment of the present invention.
Figure 3:
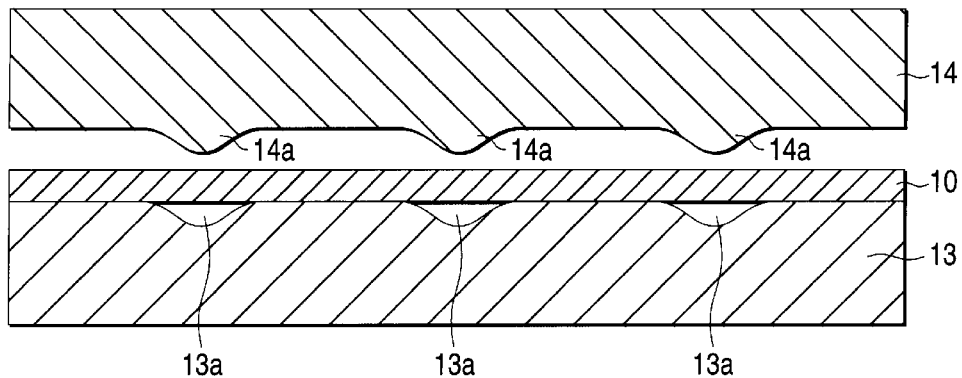
Figure 3:
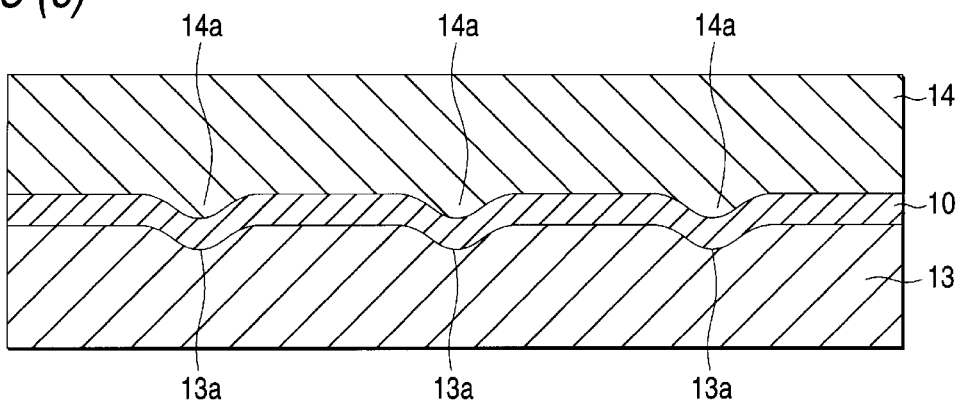
Figure 3:
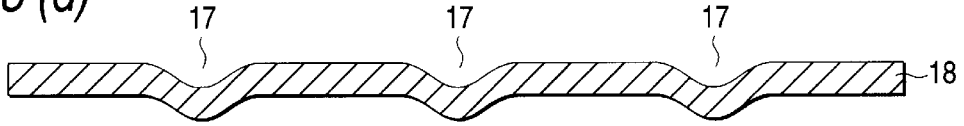
Figure 3:
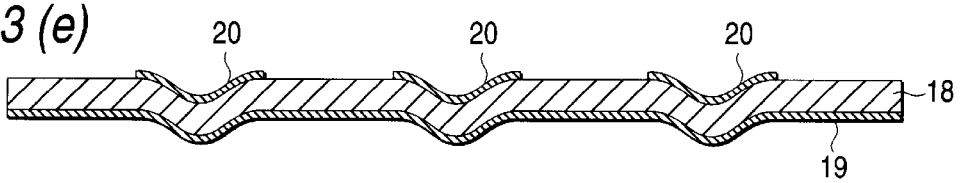

Another process for manufacturing a piezoelectric vibrator unit is also provided in accordance with the present invention, as shown in FIGS. 3(a)–3(e). According to the inventive manufacturing process, the green sheet 10 made of piezoelectric material is molded and sintered in the manner shown in FIGS. 3(a)–3(c). An elastic plate 18 is then formed which has curved portions 17 that are defined by the inwardly and outwardly curved portions 13a and 14a of the molds 13 and 14, as shown in FIG. 3(d).

Subsequently, a common electrode 19 is formed on one side of the elastic plate 18, and drive (i.e., discrete) electrodes 20 are formed on the curved portions 17 of the other side of the elastic plate 18, as shown in FIG. 3(e). A vapor deposition or sputtering process may be used to form the common and discrete electrodes 19 and 20 on the surfaces of the elastic plate 18.

Figure 4:
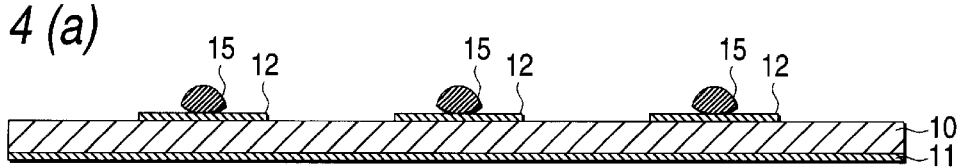
FIGS. 4(a) to 4(d) are sectional views showing a sequence of process steps of a method of manufacturing a piezoelectric vibrator unit according to still yet another embodiment the present invention.
Figure 4:
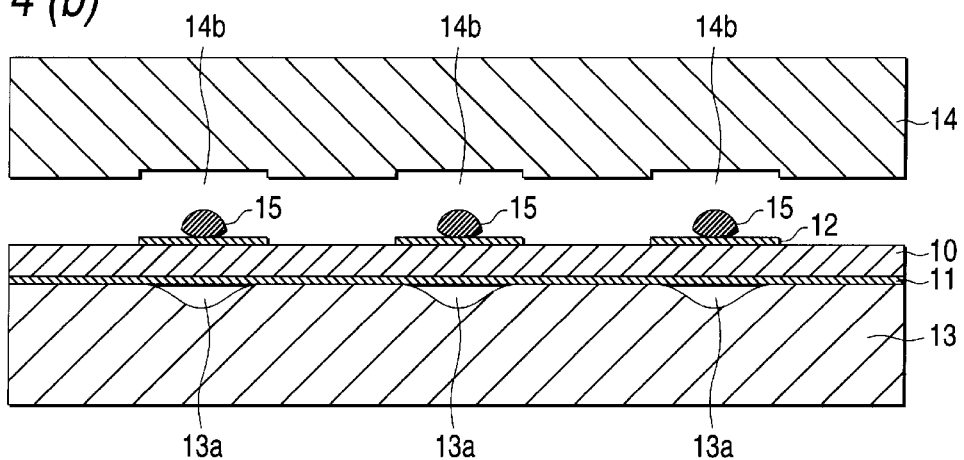
Figure 4:
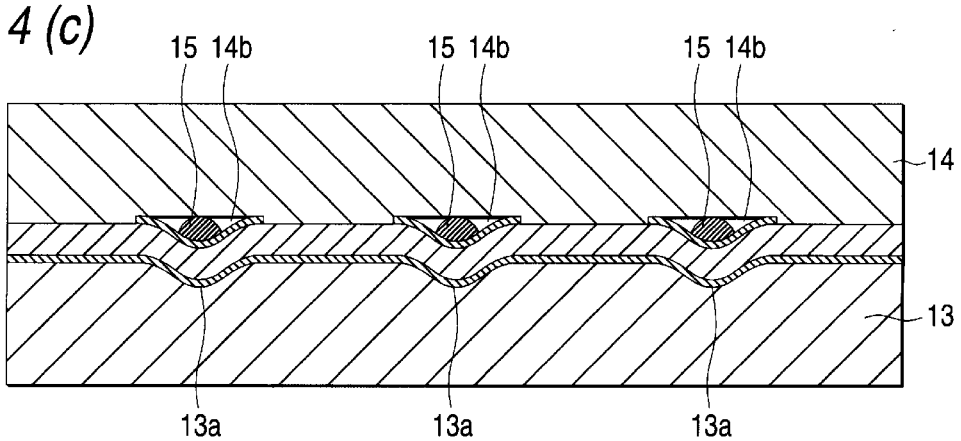
Figure 4:
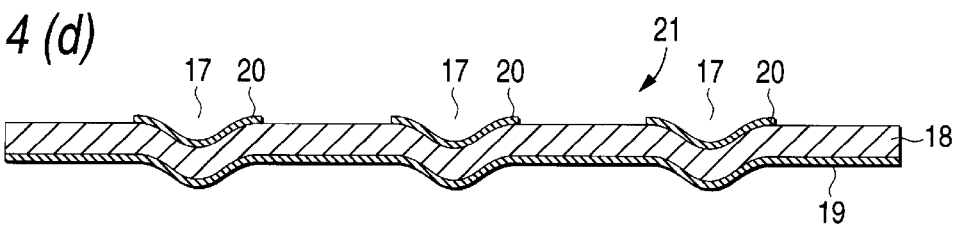

FIGS. 4(a)–4(d) show a method of manufacturing a piezoelectric vibrator unit in accordance with another embodiment the present invention. According to the inventive method, a common electrode 11 is formed on one side of a green sheet 10, and discrete electrodes 12 are formed on the other side thereof. The green sheet 10 is made of piezoelectric material, e.g., PZT. The common electrode 11 consists of a deformable layer made of conductive material, which maybe formed as a coating, as shown in FIG. 4(a). Lumps 15 are then placed on the surfaces of the discrete electrodes 12 at the same pitches as the curved portions 17 (i.e., deformable regions) to be formed, as shown in FIG. 4(a). Each of the lumps 15 has a proper shape for forming the curved portions 17 of an elastic plate when the lumps are pressed by an upper mold 14.

The green sheet 10 is sandwiched between a lower mold 13 and an upper mold 14, as shown in FIG. 4(b). The lower mold 13 has inwardly curved portions 13a that are configured in conformity with the shape of the curved portions 17. The upper mold 14 has depressions 14b which are deep enough to allow the upper mold to press the lumps 15, as shown in FIG. 4(b). The green sheet 10 is compressed by the molds 13 and 14 to which a fixed force is applied. The surface of the green sheet 10 on which the discrete electrodes 12 are formed (which corresponds to deformable regions of the green sheet 10) are inwardly deformed due to the presence of the lumps 15. In addition, portions of the other surface of the green sheet 10 on which the common electrode 11 is formed (which also correspond to the deformable regions of the green sheet 10) are outwardly deformed as defined by the configuration of the inwardly curved portions 13a of the lower mold 13.

After the green sheet 10 is taken out of the molds 13 and 14, or while the green sheet 10 is kept to be placed between the molds 13 and 14 to which a fixed pressure is applied, the green sheet 10 is sintered at a temperature, e.g., 1200° C., which is sufficient to transform the green sheet 10 into a ceramic. Through the sintering process, the lumps 15 are moltened away, as shown in FIG. 4(c). In this manner, the inventive piezoelectric vibrator unit is manufactured.

The piezoelectric vibrator unit consists of an elastic plate 19 having curved portions 17 which are defined by the inwardly curved portions 13a of the lower mold 13 and the contour of the lumps 15, a common electrode 19 layered on one side of the elastic plate 18, and discrete (i.e., drive) electrodes 20 formed on the curved portions 17 of the other side of the elastic plate, as shown in FIG. 4(d).

The manufacturing process described above may be modified in the same manner that the first embodiment was modified. According to the modified process, a green sheet 10 is first subjected to the shaping and sintering process using the lumps 15, and the molds 13 and 14. Then, a common electrode 11 and discrete electrodes 12 are disposed on the shaped and sintered green sheet 10.

Figure 5:
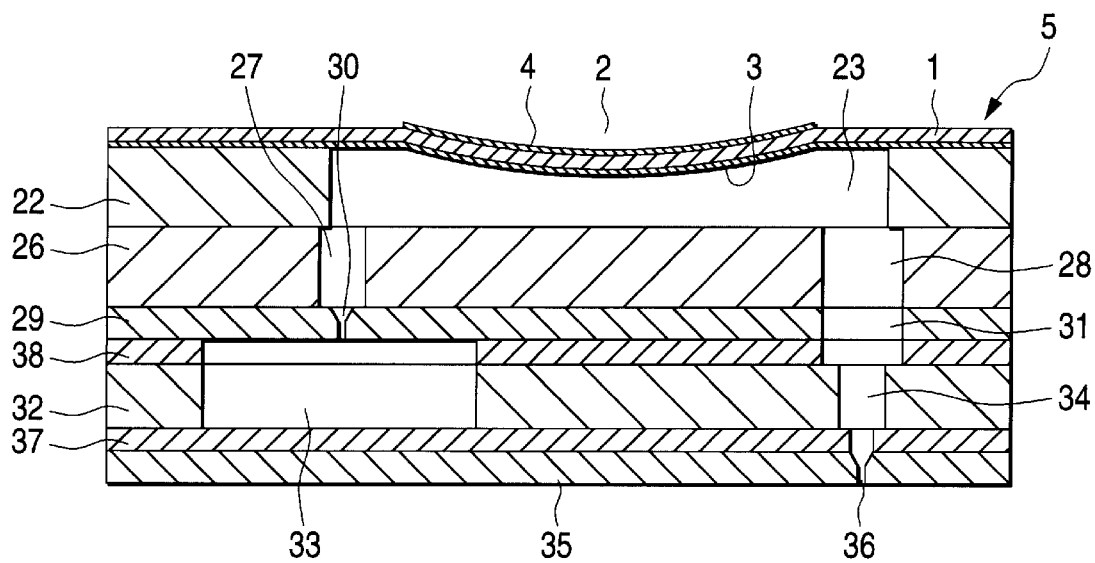
FIGS. 5(a) and 5(b) are cross-sectional views showing a portion of an ink jet recording head utilizing a piezoelectric vibrator unit constructed in accordance with the present invention.
Figure 5:
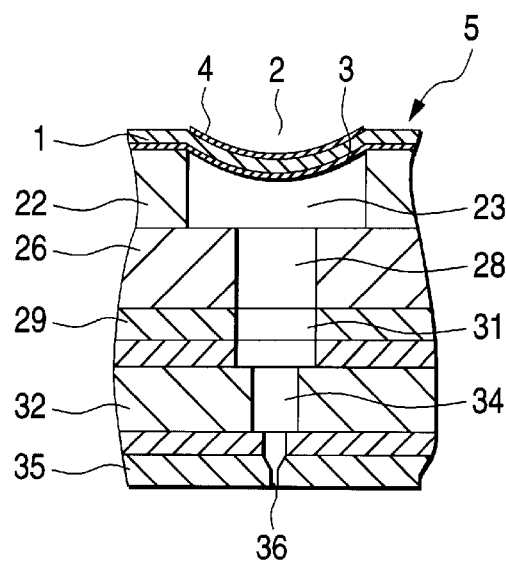

FIGS. 5(a) and 5(b) show a component ink jet recording head utilizing a piezoelectric vibrator unit 5 constructed in accordance with the present invention. The ink jet recording head includes a spacer 22 formed from a ceramic plate made of zirconia, for example. The spacer 22 has a proper thickness for forming pressure generating chambers 23 (e.g., 150 $\mu$m). Through-holes 27 and 28, which are configured so as to conform the pressure generating chambers 23, are formed at fixed pitches in a second covering member 26. By way of example, the pressure generating chamber 23 may have a discharge orifice pitch which is 90 dpi, a width which is 190 to 210 $\mu$m, and a length which is about 2 mm.

The inventive piezoelectric vibrator unit 5 serves as a first covering member which covers and seals one of the sides of the spacer 22. To this end, an initial deflection of each of the curved portions 17 of the piezoelectric vibrator unit is selected to be 5$\mu$ or larger, preferably about 30 $\mu$m or larger at the deepest part thereof, and generally one to two times as large as the thickness of the elastic plate 18.

A second covering member 26 covers and seals the other side of the spacer 22. The second covering member 26 is made of zirconia, for example. The piezoelectric vibrator unit 5, the spacer 22, and the second covering member 26 define the pressure generating chamber 23. The second covering member includes a first through-hole 27 which communicates with one end of the pressure generating chamber 23, and a second through-hole 28 which communicates with the other end of the pressure generating chamber 23.

One side of an ink-supply-port forming plate 29, which may be made of zirconia, is fixed to the second covering member 26. An ink supply port 30, which communicates with the first through-hole 27 of the second covering member 26, is formed in the ink-supply-port forming plate 29. The ink-supply-port forming plate 29 further includes a through-hole 31 which is formed at a location corresponding to the second through-hole 28 of the second covering member 26.

An ink-chamber forming plate 32 is formed from a plate member having a proper thickness for forming a common ink chamber by way of example, the plate member may be 150 μm thick and may be formed of zirconia. The ink supply port 30 has an opening at the top of the common ink chamber 33. A through-hole 34, which is formed in the ink-chamber forming plate 32, communicatively connects the pressure generating chamber 23 with a discharge orifice 36.

A nozzle plate 35 is also provided in the ink jet recording head. The nozzle plate 35 is a metal plate member, such as stainless steel. Advantageously, the metal plate member is corrosion resistant to ink. A discharge orifice 36 is formed in the nozzle plate at a location which corresponds to the pressure generating chamber 23 so that it is communicatively connected to the pressure generating chamber 23 via the through-holes 28, 31 and 34. The nozzle plate 35 is bonded to the ink-chamber forming plate 32 by means of a bonding layer 37, e.g., a thermally molten film, inserted therebetween. In addition, a bonding layer 38 is also provided for bonding the ink-supply-port forming-plate 29 to the common ink-chamber forming plate 32.

In the above-described embodiment, a drive voltage is applied between the common electrode 3 and a discrete (i.e, drive) electrode 4 which are associated with the pressure generating chamber 23 so that only the region sandwiched between the electrodes 3 and 4, (i.e., the deformable region) contracts. As a result, the curved portion 2 moves upwards and its bottom rises by an amount ΔH, as shown in FIG. 1(b).

When the curved portion 2 moves upwards, the volume of the pressure generating chamber 23 increases and ink flows from the common ink chamber 33 into the pressure generating chamber 23 through the passage including the ink supply port 30 and the first through-hole 27.

In this state, an electric charge of the elastic plate 1 in the deformable region is discharged and the elastic plate 1 is restored to its original shape. In particular, the original shape of the curved portion 2 is restored and the volume of the pressure generating chamber 23 decreases. Consequently, the pressure generating chamber 23 compresses ink therein, so that the ink is discharged outside through the discharge orifice 36 in the form of an ink droplet.

It is noted that the elastic plate 1 includes curved portions 2 that are formed by curving the elastic plate per se. With this unique elastic plate, the expansion and/or contraction of the elastic plate 1 can easily vary the volume of the pressure generating chamber, as compared to the case in which a deflection deformation is caused by expanding and contracting a planar vibrating plate. Therefore, the volume of the pressure generating chamber 23 increases when it sucks ink into itself and decreases when it discharges the ink droplet at a faster rate when a curved vibrating plate is used in the ink jet recording head instead of a planar vibrating plate. As a result, ink droplets can be more efficiently discharged from the ink jet recording head under the application of the same drive signal.

Figure 6:
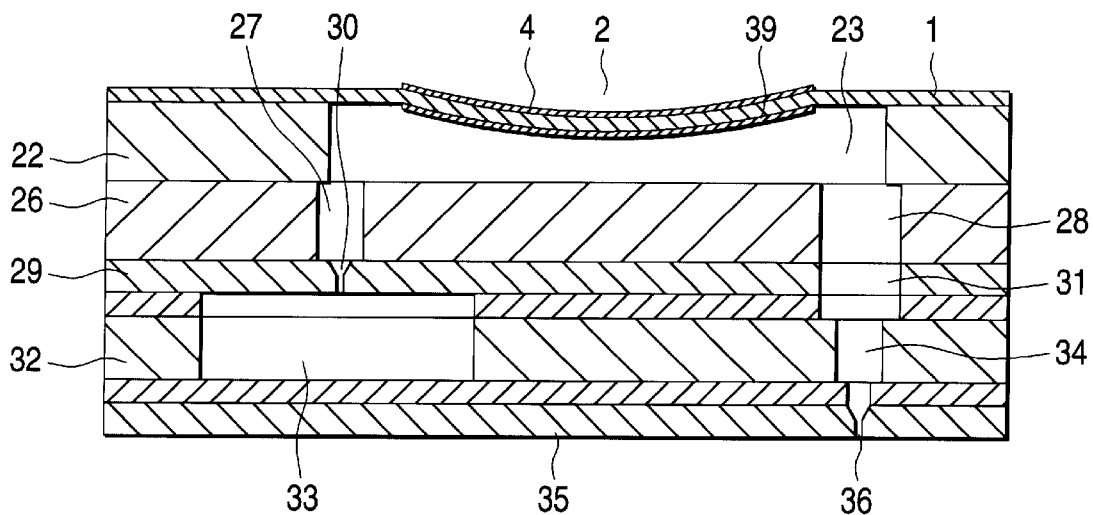
FIGS. 6(a) and 6(b) are cross-sectional views showing another ink jet recording head utilizing a piezoelectric vibrator unit constructed in accordance with the present invention.
Figure 6:
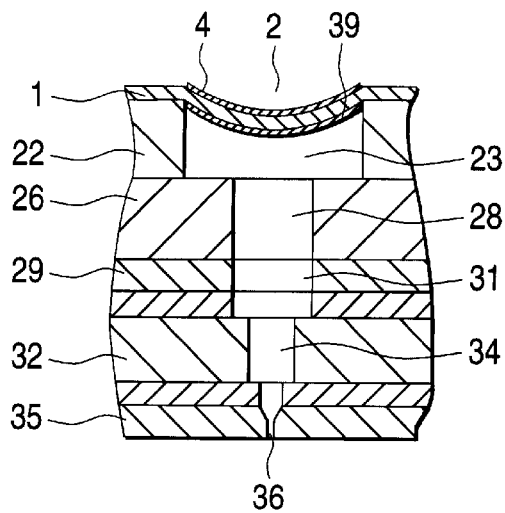

In the above-mentioned embodiment, the electrode 3 is used as a common electrode. In an ink jet recording head which embodies another aspect of the present invention, at least one discrete electrode 39 is used in place of the common electrode as shown in FIGS. 6(a) and 6(b). The electrode 39 is formed on the lower side of the deformable region so that it is exposed to the pressure generating chamber 23.

Figure 7:
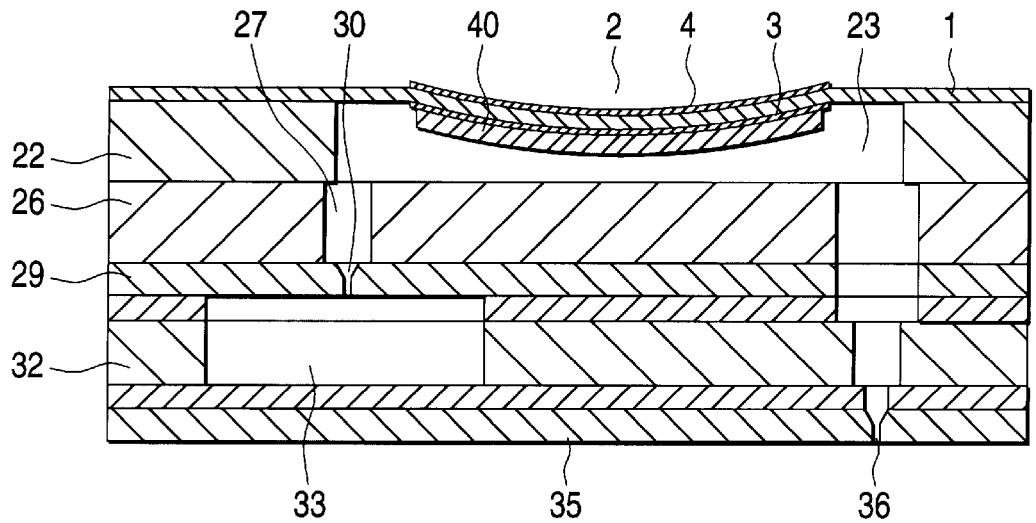
FIGS. 7(a) and 7(b) are cross-sectional views showing still another ink jet recording head utilizing a piezoelectric vibrator unit constructed in accordance with the present invention.
Figure 7:
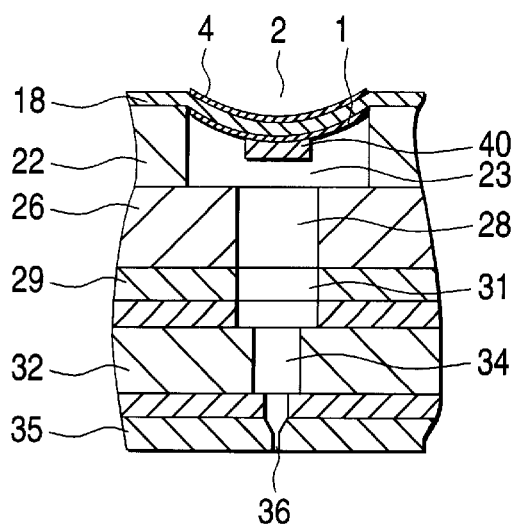

FIGS. 7(a) and 7(b) show an ink jet recording head incorporating a piezoelectric vibrator unit according to another aspect of the present invention. As shown in FIGS. 7(a) and 7(b), a vibration inducing plate 40 is layered on the common electrode 3 on the inner side of each curved portion 2 of the elastic plate 1. In addition, the vibration inducing plate 40 extends in the longitudinal direction of the pressure generating chamber 23 and on a central line on the inner side of the curved portion 2. The vibration inducing plate 40 is made of a material having a lager rigidity than the piezoelectric material of the elastic plate 1. By way of example, the vibration inducing plate 40 may be made of metal or ceramic. In addition, a vibration inducing plate may be formed on the discrete electrode alone, or in addition to the vibration inducing plate which is formed on the common electrode.

Advantageously, the vibration inducing plate 40 cooperates with the elastic plate 1 to provide a bimetal effect. Therefore, the deformable region is more easily bendable, and its endurance against a pressure generated at the time of applying pressure to the ink is improved by an amount corresponding to the increase of the thickness of the deformable region structure. Accordingly, pressure can be efficiently applied to the ink.

Figure 8:
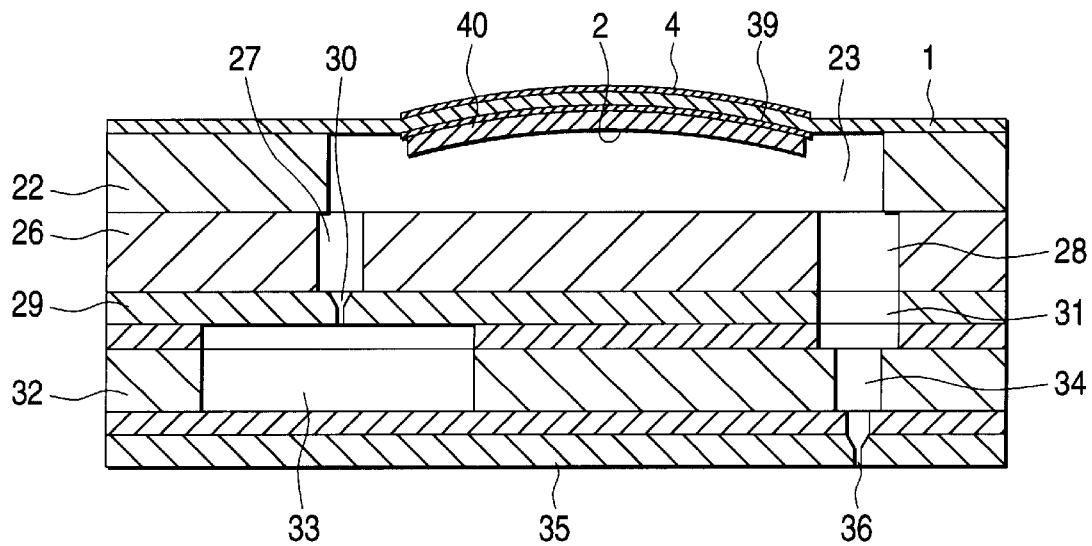
FIGS. 8(a) and 8(b) are cross-sectional views showing yet another ink jet recording head utilizing a piezoelectric vibrator unit constructed in accordance with the present invention.
Figure 8:
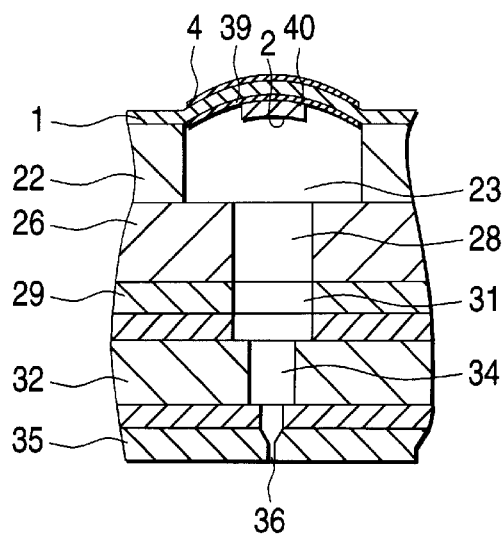

In the embodiments mentioned above, the curved portions 2 of the elastic plate 1 are each curved toward the pressure generating chamber 23. However, those curved portions 2 may also be outwardly curved, as shown in FIGS. 8(a) and 8(b). In this case, if the vibration inducing plates 40 are required, they may be formed on the side of the elastic plate 1 that faces the pressure generating chambers 23.

In the embodiments mentioned above, the common electrodes 3 are exposed to ink in the pressure generating chambers 23. Therefore, the common electrodes 3 are preferably covered with layers (each having a thickness, e.g., 1 μm) which will not interrupt a vibration of the deformable region structure. These layers may be made of piezoelectric material, such as silicon oxide, zirconia, or the like. Where the electrodes 3 are covered with the layers, the electrodes are separated from ink and prevented from being corroded.

As a further refinement, the spacer 22 and the covering member 26 may be formed from ceramic material other than zirconia, such as alumina. Further, if the spacer 22, the covering member 26 and the elastic plate 1 are made of the same material, those members may be formed in a one-piece construction.

Figure 9:
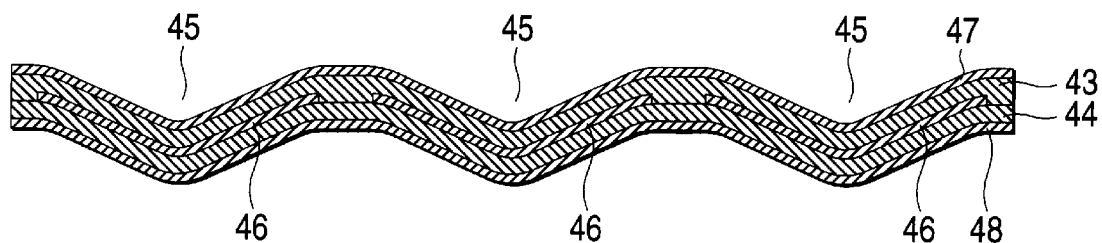
FIG. 9 is a cross-sectional view showing still yet another embodiment of a piezoelectric vibrator unit according to the present invention.

FIG. 9 shows a piezoelectric vibrator unit according to another embodiment of the present invention. The piezoelectric vibrator unit includes thin plates 43 and 44 made of piezoelectric material which are curved so as to form curved portions 45 that are lengthwise arrayed at fixed pitches. Individual electrodes 46 are buried in the curved portions 45, as shown in FIG. 9. In addition, common electrodes 47 and 48 are layered on the exposed surfaces of the thin plates 43 and 44 made of piezoelectric material.

In operation, a drive signal is applied to those electrodes 46, 47 and 48 in order to generate electric fields, which are in the same direction, so that a deformable region of the curved portion 45 is a deformed. Since the plates 43 and 44 made of piezoelectric material are thin, a low voltage of the drive signal may be used for generating the required electric fields.

Figure 10:
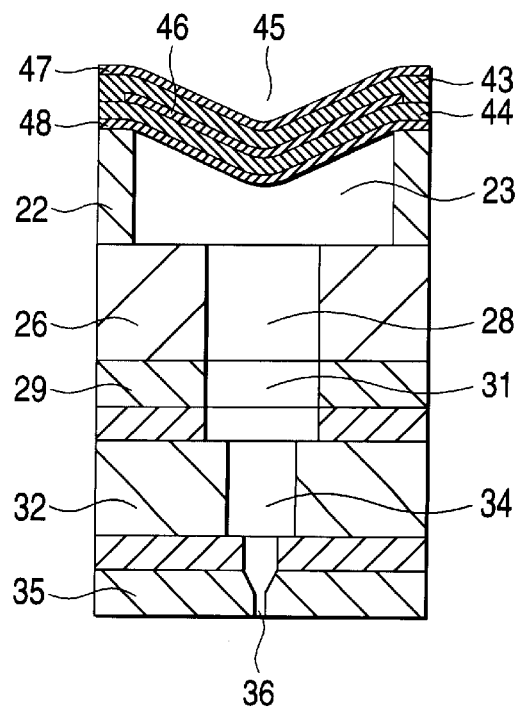
FIG. 10 is a partial cross-sectional view showing an ink jet recording head incorporating the piezoelectric vibrator unit of FIG. 9.

FIG. 10 is a partial cross-sectional view showing an ink jet recording head incorporating the piezoelectric vibrator unit of FIG. 9. With the exception of the piezoelectric vibrator unit, the ink jet recording head is similar the embodiments described above.

The piezoelectric vibrator unit is fixed to the spacer 22 so that the curved portion 45 is located in the corresponding pressure generating chamber 23 defined by the spacer 22. Advantageously, the ink droplet can be discharged by a relatively low drive voltage.

Figure 11:
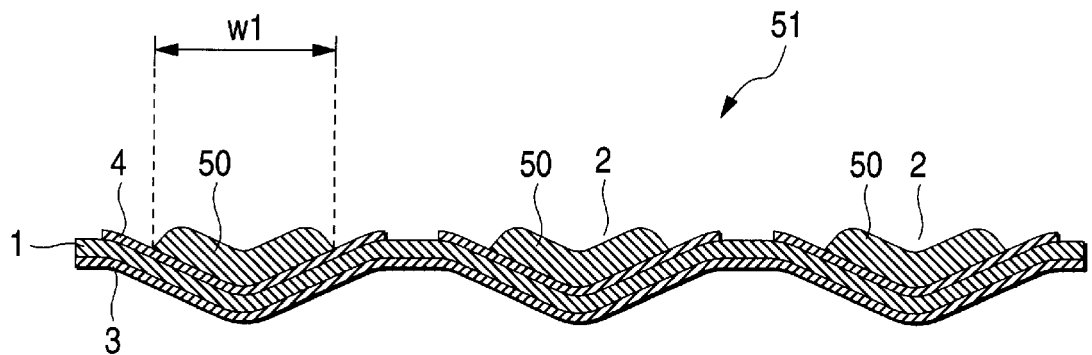
FIG. 11 is a cross-sectional view showing a piezoelectric vibrator unit according to another embodiment of the present invention.

FIG. 11 is a cross-sectional view showing a piezoelectric vibrator unit 51 according to yet another embodiment of the present invention. The piezoelectric vibrator unit 51 includes fillers 50 which are placed on and along the upper side of the curved portions 2 of the piezoelectric vibrator unit 51. The piezoelectric vibrator unit 51 may be made of high polymer, for example. In all other respects, the piezoelectric vibrator unit 51 is similar to the one shown in FIG. 1(a).

Figure 12:
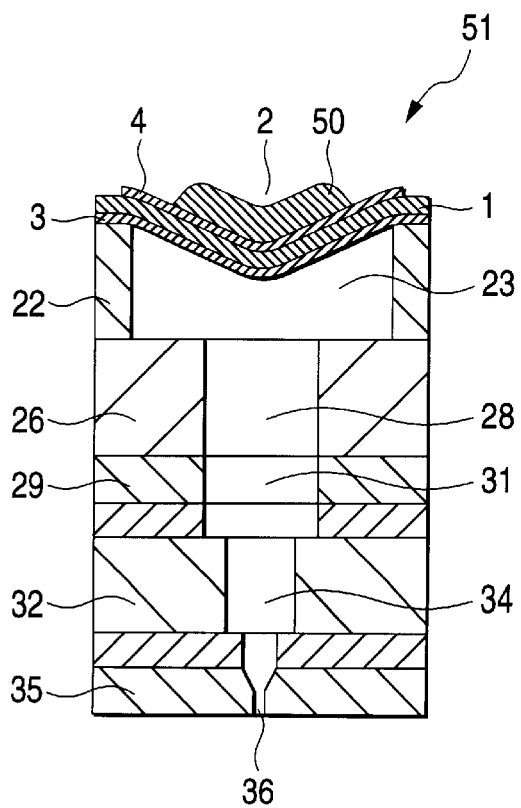
FIG. 12 is a partial cross-sectional view showing an ink jet recording head incorporating the piezoelectric vibrator unit of FIG. 11.

FIG. 12 is a partial cross-sectional view showing an ink jet recording head incorporating the piezoelectric vibrator unit 51 of FIG. 11. With the exception of the piezoelectric vibrator unit 51, the ink jet recording head is similar to the embodiments described above. In the ink jet recording head, the piezoelectric vibrator unit 51 is fixed to a spacer 22 so that the lower side of a curved portion 2 thereof is located in a corresponding pressure generating chamber 23 defined by the spacer 22.

Figure 13:
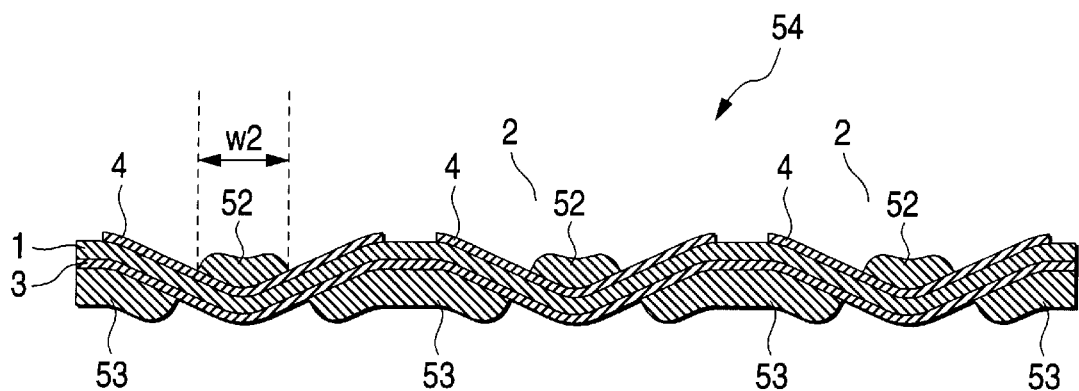
FIG. 13 is a cross-sectional view showing a piezoelectric vibrator unit according to yet another embodiment of the present invention.

FIG. 13 is a cross-sectional view showing a piezoelectric vibrator unit according to yet another embodiment of the present invention. In the piezoelectric vibrator unit 54, fillers 52 are disposed on the upper side of the curved portions 2 of the elastic plate 1. The width w2 of each filler 52 is slightly shorter than the width w1 of the filler 50 shown in the FIG. 11. In addition, second fillers 53 are placed on a lower side of the curved portions 2 of the elastic plate 1. Each of the second fillers 53 extends so that its left end reaches a position corresponding to the right end of an adjacent filler 52 located to the left of that filler 53. Similarly, the right end of each filler 53 reaches to a position corresponding to the left end of an adjacent filler 52 located on the right side of that filler 53.

Figure 14:
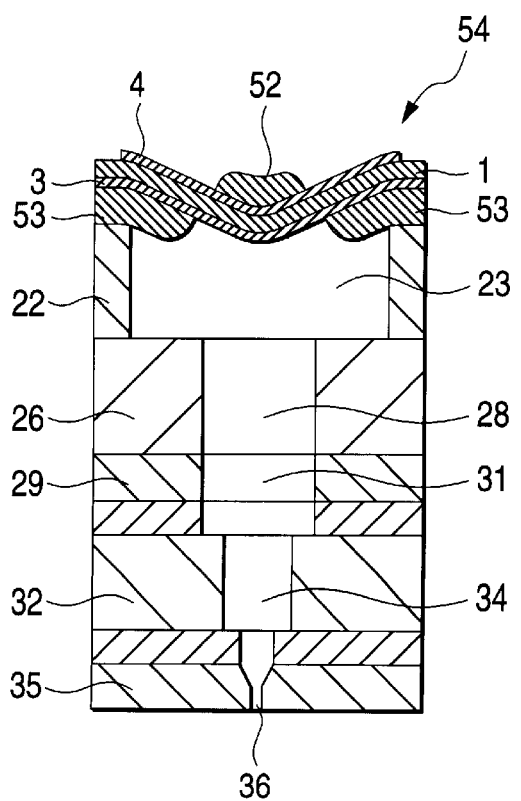
FIG. 14 is a partial cross-sectional view showing an ink jet recording head incorporating the piezoelectric vibrator unit of FIG. 13.

FIG. 14 is a partial cross-sectional view showing an ink jet recording head incorporating the piezoelectric vibrator unit of FIG. 13. With the exception of the piezoelectric vibrator unit 54, the ink jet recording head is similar to the embodiments described above. In the ink jet recording head, the piezoelectric vibrator unit 54 is fixed to a spacer 22 so that the lower side of a curved portion 2 is located in a corresponding pressure generating chamber 23 defined by the spacer 22. Portions of the second fillers 53 are put on corresponding surfaces of walls of the pressure generating chamber 23, the walls being defined by the spacer 22.

Figure 15:
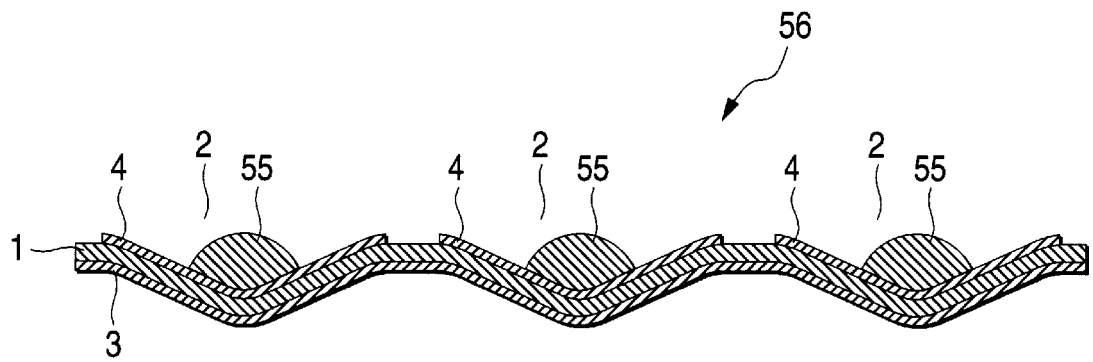
FIG. 15 is a cross-sectional view showing a piezoelectric vibrator unit according to still yet another embodiment of the present invention.

FIG. 15 is a cross-sectional view showing a piezoelectric vibrator unit according to yet another embodiment of the present invention. The piezoelectric vibrator unit 56 includes a filler 55 which is placed on the upper side of each curved portion 2 of an elastic plate 1. The filler 55 may be configured independently of the shape of the curved portion 2.

Figure 16:
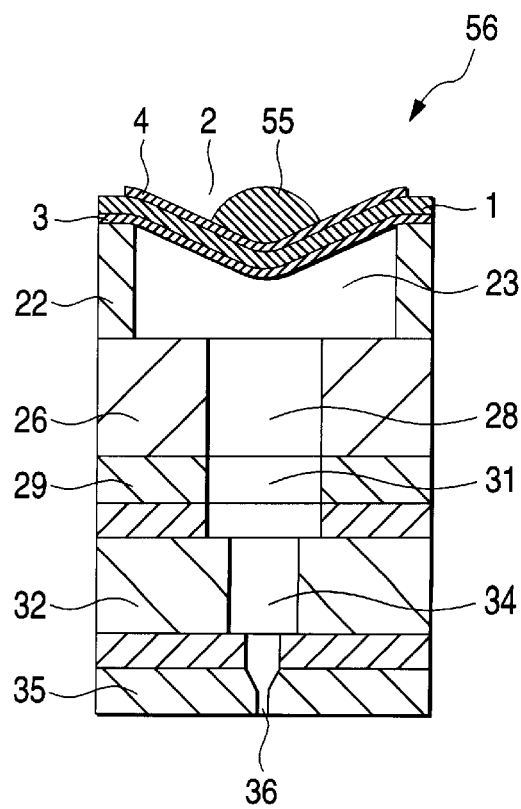
FIG. 16 is a partial cross-sectional view showing an ink jet recording head incorporating the piezoelectric vibrator unit of FIG. 15.

FIG. 16 is a partial cross-sectional view showing an ink jet recording head incorporating the piezoelectric vibrator unit 56 of FIG. 15. With the exception of the piezoelectric vibrator unit 56, the ink jet recording head is similar to the embodiments described above. In the ink jet recording head, the piezoelectric vibrator unit 56 is fixed to the spacer 22 so that the lower side of a curved portion 2 is located in a corresponding pressure generating chamber 23 defined by the spacer 22.

Figure 17:
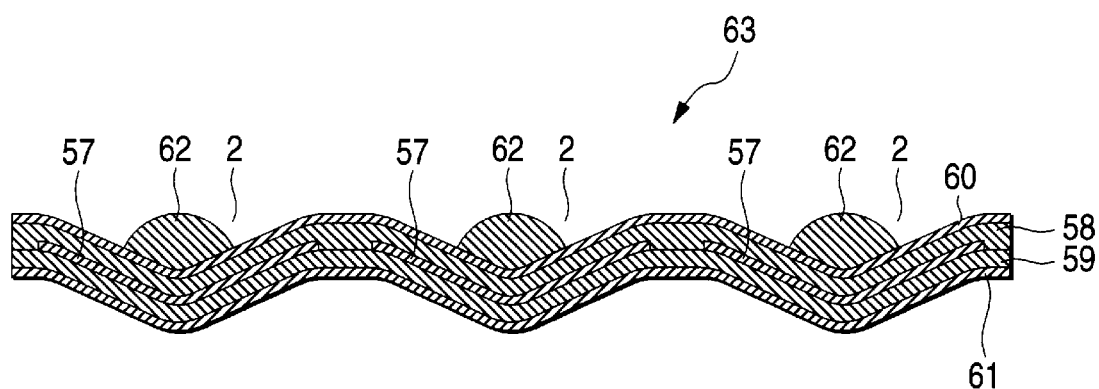
FIG. 17 is a cross-sectional view showing a piezoelectric vibrator unit according to still another embodiment of the present invention.

FIG. 17 is a cross-sectional view showing a piezoelectric vibrator unit according to still yet another embodiment of the present invention. In the piezoelectric vibrator unit 63 of this embodiment, an elastic plate is formed from a couple of layered thin plates 58 and 59. However, discrete electrodes 57 are sandwiched between the thin plates 58 and 59 at the locations of corresponding curved portions 2. Common electrodes 60 and 61 are layered on the upper and lower sides (when viewed in the drawing) of the elastic plate. In addition, fillers 62, which are upwardly curved, are placed on the upper side of the curved portions 2.

Figure 18:
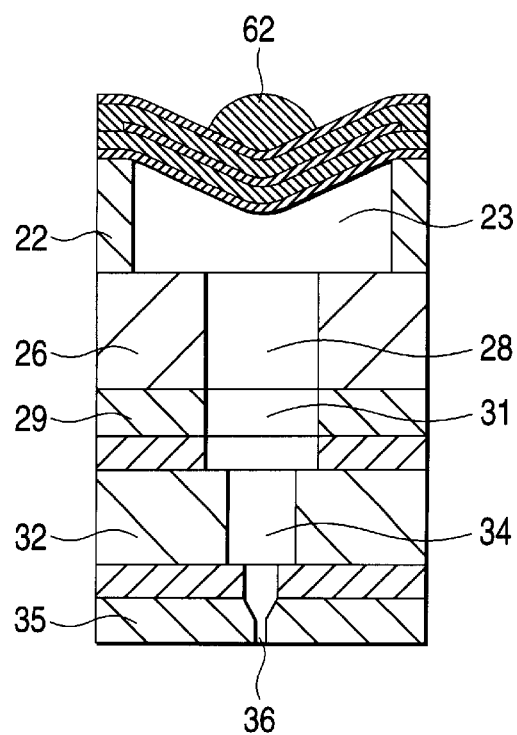
FIG. 18 is a partial cross-sectional view showing an ink jet recording head incorporating the piezoelectric vibrator unit of FIG. 17.

FIG. 18 is a partial cross-sectional view showing an ink jet recording head incorporating the piezoelectric vibrator unit 63 of FIG. 17. With the exception of the piezoelectric vibrator unit 63, the ink jet recording head is similar to the embodiments described above. In the ink jet recording head, the piezoelectric vibrator unit 63 is fixed to a spacer 22 so that a lower side of a curved portion 2 is located in a corresponding pressure generating chamber 23 defined by the spacer 22.

Figure 19:
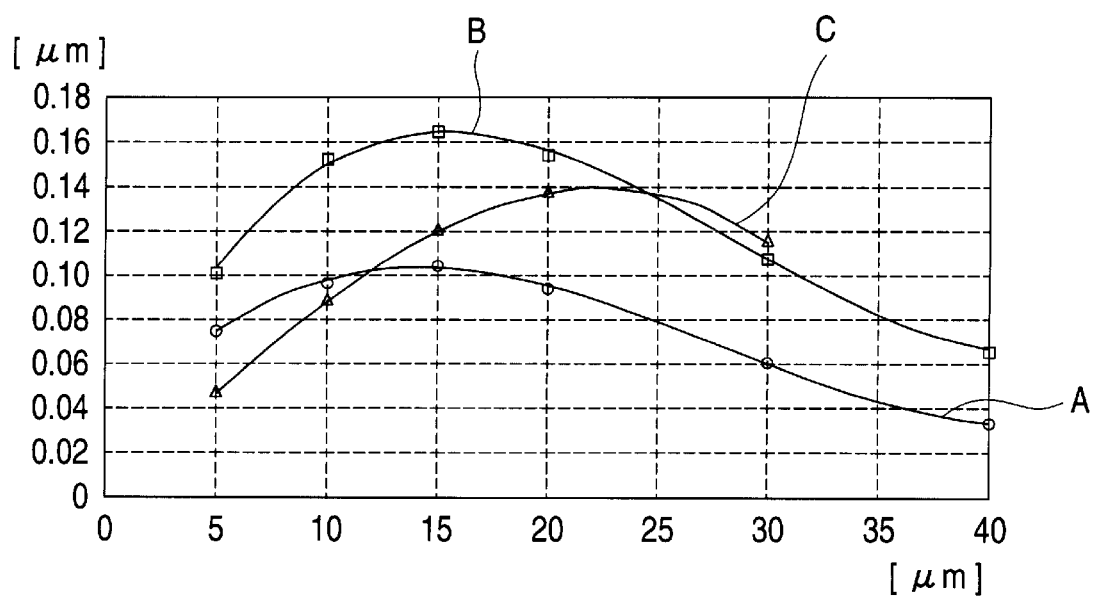
FIG. 19 is a graph showing variations of the quantities of deflection of the curved portions of the piezoelectric vibrator units of FIGS. 9, 11 and 13 with respect to initial deflection quantities thereof.

FIG. 19 is a graph showing variations of the magnitude of deflection of the curved portions A, B and C of the piezoelectric vibrator units shown in FIGS. 9, 11 and 13, respectively, with respect to an initial deflection magnitude thereof. To plot the graph, the magnitude of deflection of each of the curved portions was measured under a fixed voltage of a drive signal that is applied to the curved portion of the piezoelectric vibrator unit. The thickness of the elastic plate used was 10 $\mu$m. The curved portions of the elastic plate were arrayed at pitches of 150 $\mu$m along the piezoelectric vibrator unit.

As seen from the graph, in the piezoelectric vibrator unit of FIG. 11 where fillers 50 are respectively placed on and along (after the shape of) the upper side of the curved portions 2, a great displacement of the curved portion is caused with its initial deflection being small.

Figure 20:
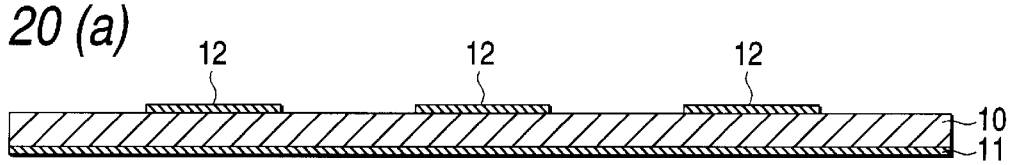
FIGS. 20(a) to 20(d) are sectional views showing a sequence of process steps of an additional embodiment of a method of manufacturing a piezoelectric vibrator unit according to the present invention.
Figure 20:
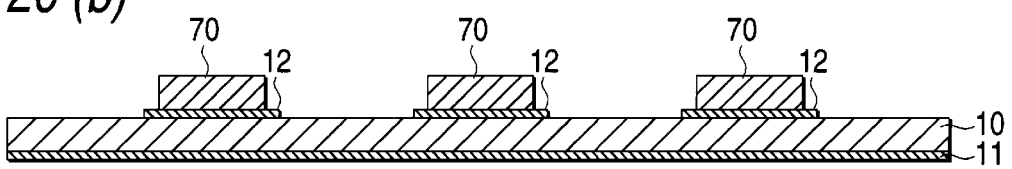
Figure 20:
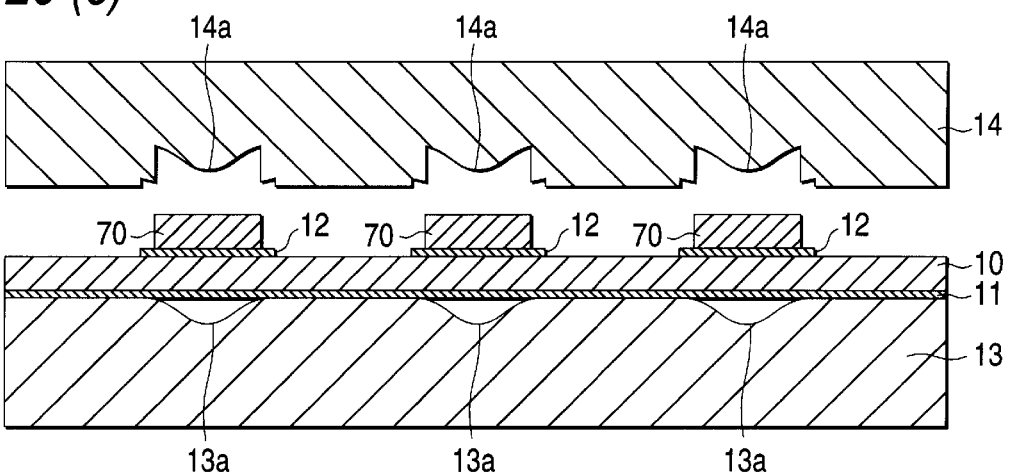
Figure 20:
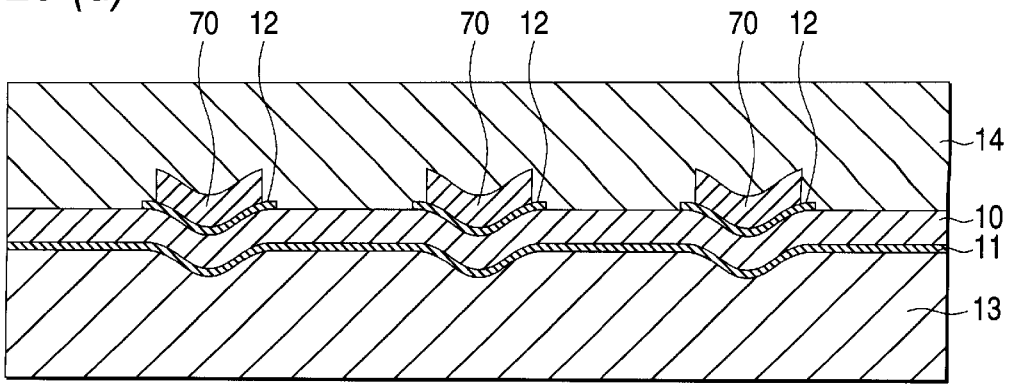

FIGS. 20(a)–20(d) shows an embodiment of a method of manufacturing a piezoelectric vibrator unit which is similar to the one shown in FIG. 2(d). Initially, discrete electrodes 12 are formed on one side of a green sheet 10 in the regions thereof which will define the inwardly curved side of the curved portions of the piezoelectric vibrator unit, as shown in FIG. 20(a). The discrete electrodes 12 are deformable and are made of conductive material. By way of example, the electrodes 12 may be formed as a conductive coating. The green sheet 10 is made of piezoelectric material, such as PZT. If necessary, a common electrode 11 can be provided which is also deformable and made of conductive material. The common electrode 11 is formed on the other side of the green sheet 10, as shown in FIG. 20(b). In addition, green sheets 70, which are used as fillers, are formed on the discrete electrodes 12. The green sheets 70 are made of heat resistant material, e.g., ceramic, which is deformable when it is under pressure.

The green sheet 10 having the electrodes 11 and 12 and the green sheets 70 is inserted between a lower mold 13 and an upper mold 14, as shown in FIG. 20(c). The lower mold 13 has inwardly curved portions 13a which are each configured in conformity with a curved portion of the piezoelectric vibrator unit. The upper mold 14 has outwardly curved portions 14a. Subsequently, the green sheet 10 is compressed with the upper and lower molds 14 and 13 so that the green sheet 10, having the electrodes and the green sheets 70, is molded into a shape defined by the combined molds 13 and 14, as shown in FIG. 20(d).

After the green sheet 10 is taken out of the molds 13 and 14, or while the green sheet 10 is kept to be placed between the molds 13 and 14 under a fixed pressure, the green sheet 10 is sintered at a temperature, e.g., 1200° C., which is sufficient to transform it into a ceramic. As a result, the green sheet 10, made of piezoelectric material, and the green sheets 70, which will be used as fillers, are transformed into a ceramic so that a piezoelectric vibrator unit is manufactured.

In the just described embodiment, the green sheet 10 is sintered after the common electrode 11 is formed thereon. However, the common electrode may be formed on the green sheet 10 by vapor deposition, sputtering, or the like after the green sheet is sintered.

Although the fillers are formed by a sintering process, they also may be formed so that the curved portions 2 of the piezoelectric vibrator unit 5 are coated with a high polymer.

In the piezoelectric vibrator unit 5, the electrodes are provided on both sides of the elastic plate. When the piezoelectric vibrator unit is incorporated into the recording head, the common electrode formed on the reverse side of the elastic plate is covered with the spacer of the recording head. Therefore, it is difficult to connect the electrode to an external drive circuit.

Figure 21:
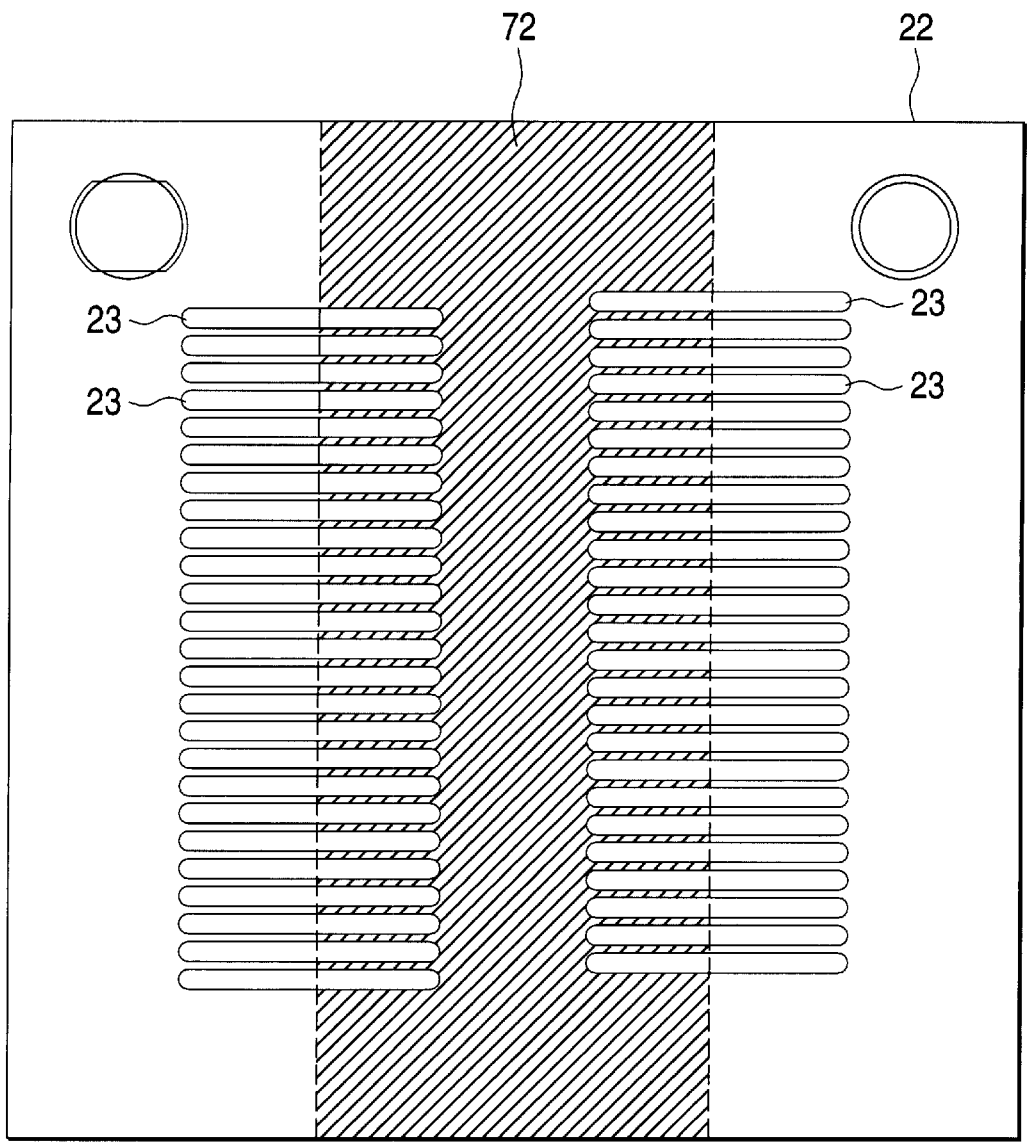
FIG. 21 is a diagram showing a structure for leading out an electrode formed on a piezoelectric vibrator unit in an ink jet recording head using the piezoelectric vibrator unit as an actuator.
Figure 22:
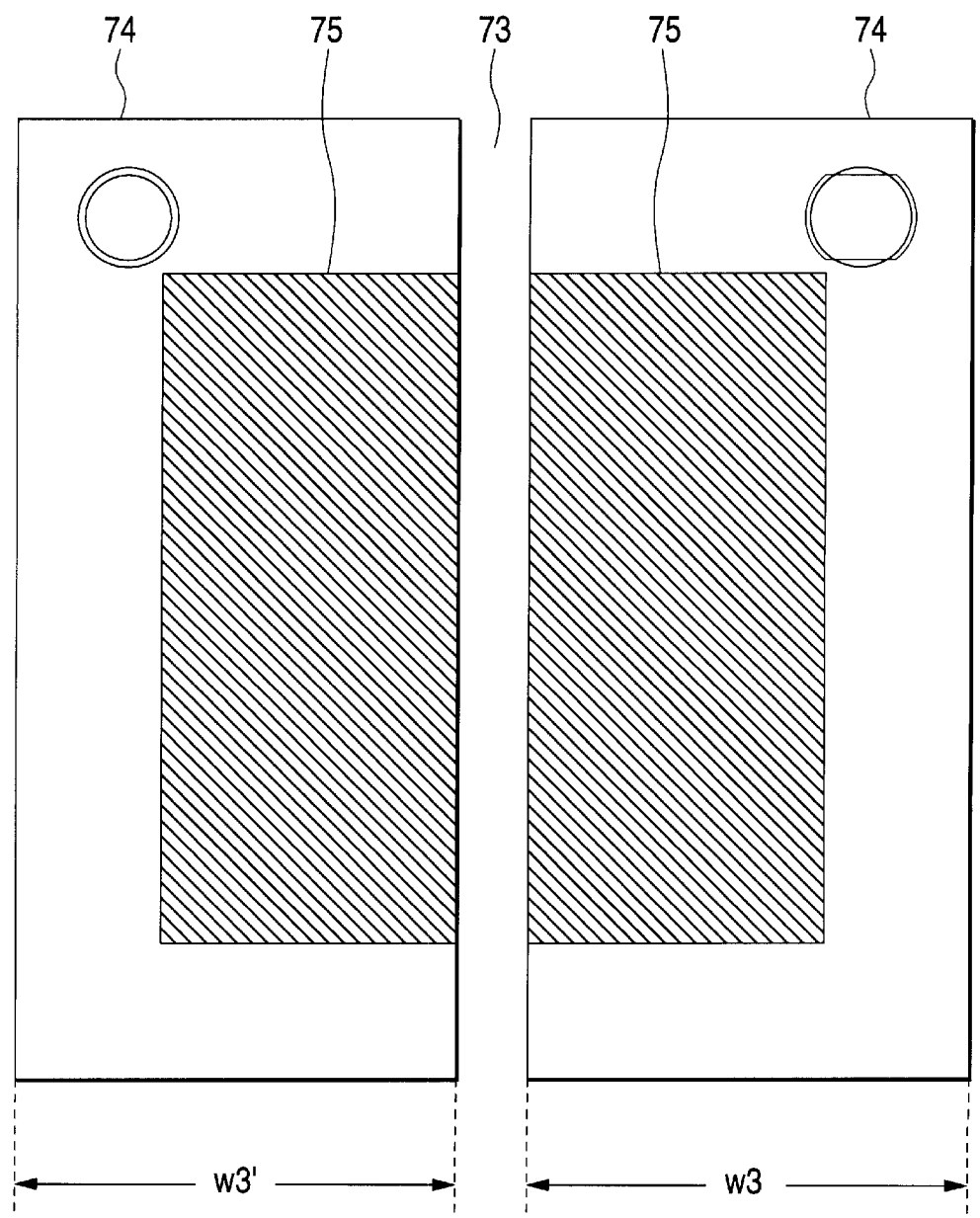
FIG. 22 is a diagram showing the rear sides of the separated piezoelectric vibrator units in the electrode lead-out structure of FIG. 21.

An example of a spacer which can solve the above-mentioned problem is shown in FIG. 21. According to the present invention, a conductive layer 72 is formed on the surface of the spacer 22 to which piezoelectric vibrator units will be fixed. The conductive layer 72 extends through a region of the spacer surface which contacts the common electrodes 75 of the piezoelectric vibrator unit 74 and a region of the spacer surface, which is free from a vibration of the piezoelectric vibrator units 74 (the central region of the spacer surface where two series of pressure generating chambers 23 are confronted with each other in this embodiment).

Figure 23:
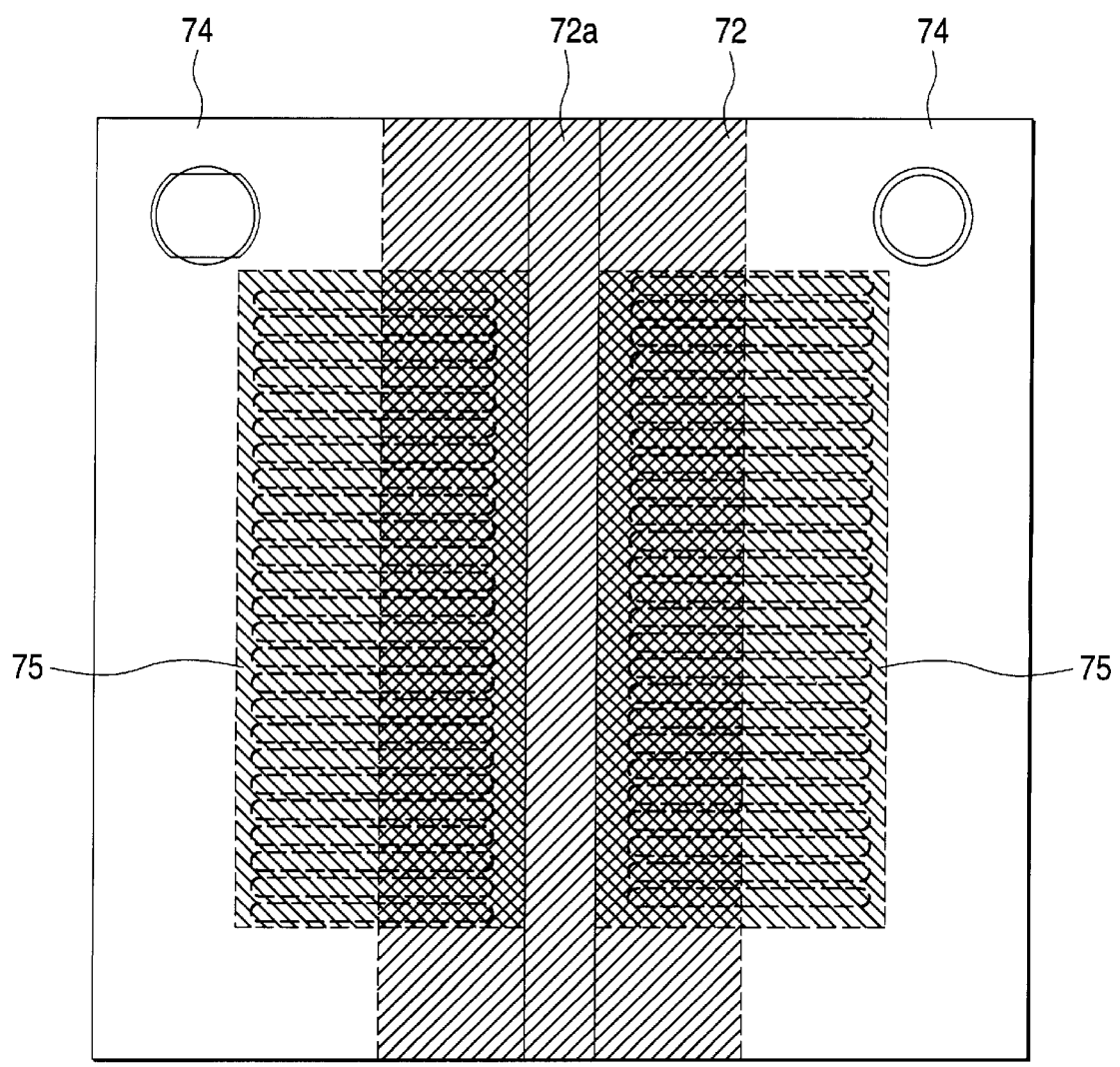
FIG. 23 is a diagram showing a conductive layer formed on the spacer and common electrodes formed on the rear sides of the piezoelectric vibrator units in the electrode lead-out structure of FIG. 21.

When the piezoelectric vibrator units 74 are set on the spacer 22 with the conductive layer 72 such that the curved portions 2 of the piezoelectric vibrator units 74 are positioned within the pressure generating chambers 23, as shown in FIG. 23, the piezoelectric vibrator units 74 are formed having corresponding widths, W3 and W3'. These dimensions ensure that a gap 73 is produced between the vibrator units 74. In addition, the common electrode 75 is formed to reach the conductive layer 72 of the spacer 22 so that the later has an exposed portion 72a, as shown in FIG. 23. To connect the common electrodes of the piezoelectric vibrator units, the exposed portion 72a of the conductive layer 72 is connected to an external drive circuit by a flexible cable, for example.

Figure 24:
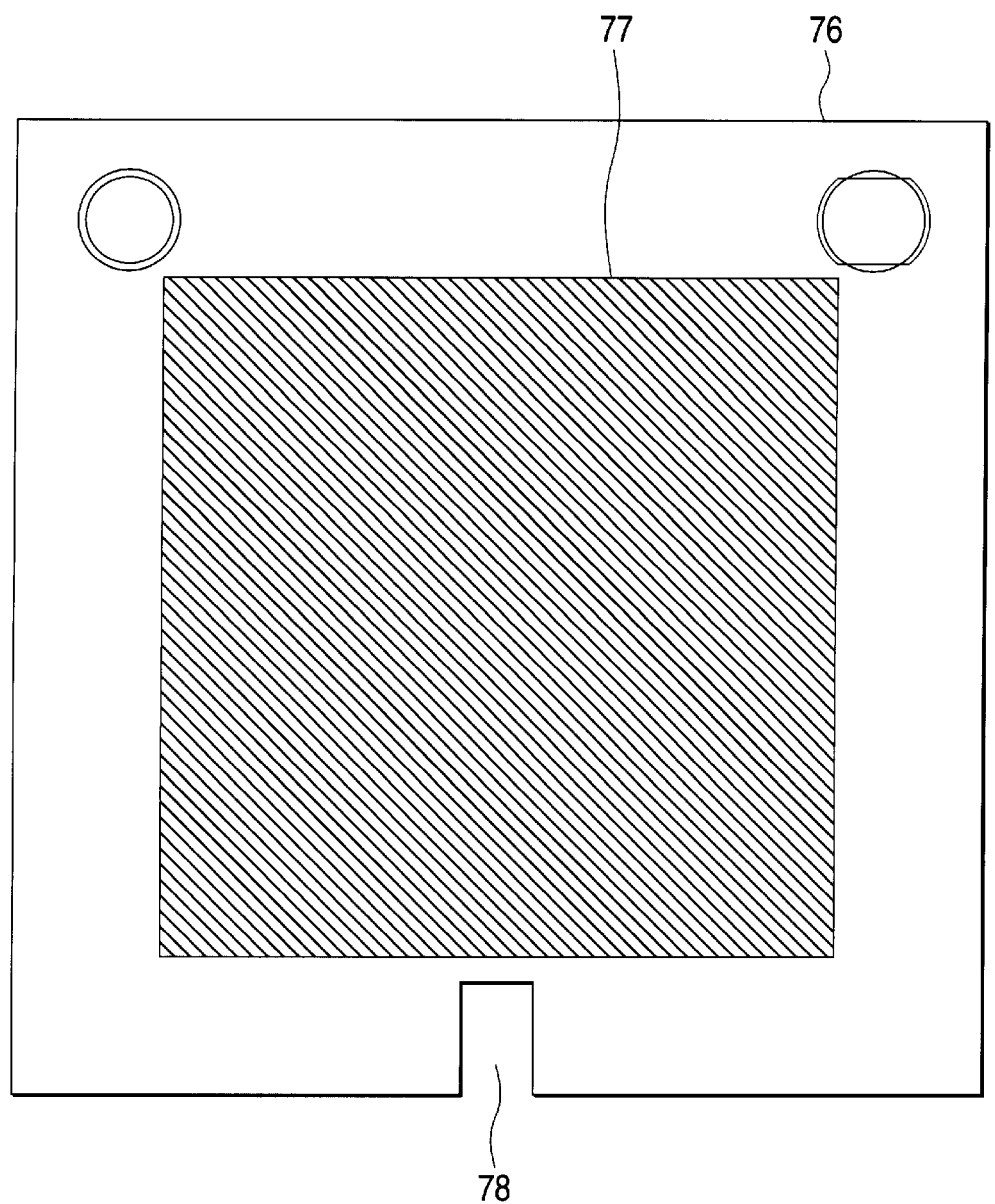
FIG. 24 is a diagram showing another electrode lead-out structure in an ink jet recording head using the piezoelectric vibrator unit as an actuator.

In the embodiment described above, to expose the conductive layer of the spacer, two piezoelectric vibrator units are separately arranged. However, a single piezoelectric vibrator unit may be applied to the two series of pressure generating chambers of the spacer, as a matter of course. In this case, which is shown in FIG. 24, a piezoelectric vibrator unit 76 is cut out to form a cutout portion 78 which faces a conductive layer 77 of the spacer 22. By including the cutout portion 78, the conductive layer 77 formed on the spacer may be exposed through the cutout portion 78 even when the piezoelectric vibrator unit is layered over the spacer.

The piezoelectric vibrator unit is sintered, and then fixed to the spacer 22 in the above-mentioned embodiments depicted in FIGS. 21–24. Advantageously, the spacer 22 may be used for a molding member in order to form the deflecting member of the piezoelectric vibrator unit of the present invention. The use of the spacer in this fashion is shown in FIGS. 25(a)–(c).

Figure 25:
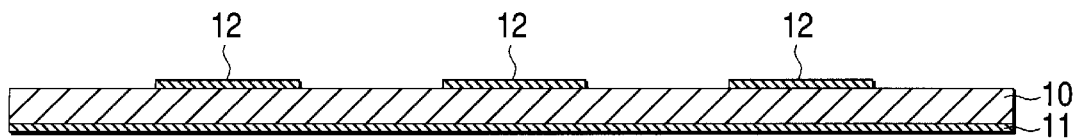
FIGS. 25(a) to 25(c) are sectional views showing a sequence of process steps of a method of manufacturing a piezoelectric vibrator unit according to an embodiment of the present invention.
Figure 25:
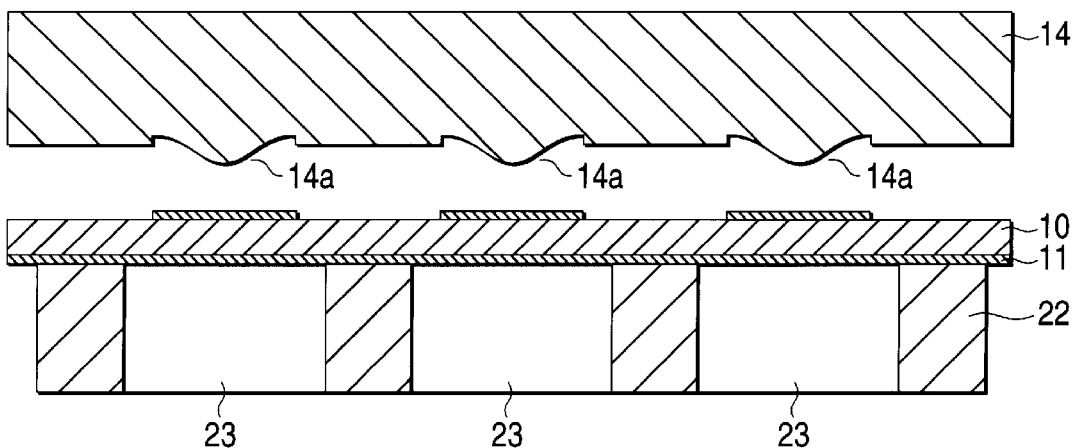
Figure 25:
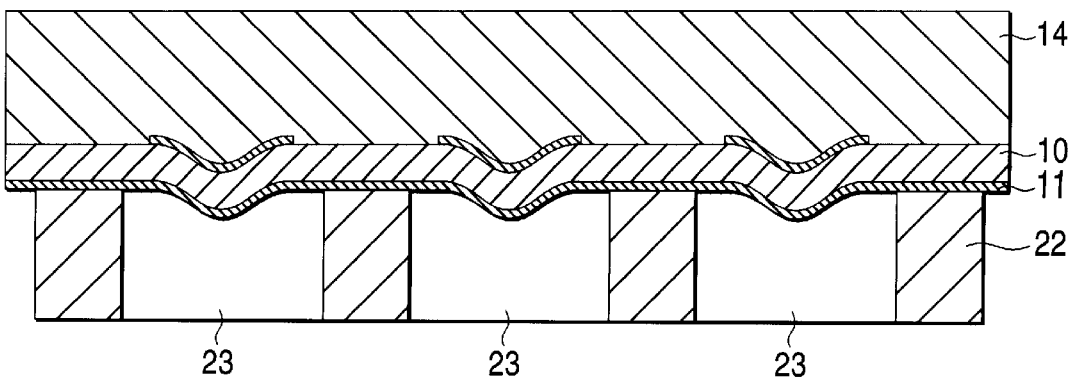

In particular, a common electrode 11 may be formed on one side of a green sheet 10 and discrete electrodes 12 formed on the other side thereof, as shown in FIG. 25(a). The green sheet 10 is made of piezoelectric material, for example, PZT. The common electrode 11 is deformable and made of conductive material, such as a conductive coating.

The green sheet 10 having the electrodes 11 and 12 is positioned so that the discrete electrodes 12 on the green sheet 10 lie above the pressure generating chambers 23 of the spacer 22, respectively. An upper mold 14 is provided which has outwardly curved portions 14a arrayed at the same pitches as the pressure generating chambers 23, as shown in FIG. 25(b). The spacer 22 is used as a lower mold.

The upper mold 14 is pressed against the green sheet 10 and the lower mold 22 by applying a fixed pressure to the upper mold 14, as shown in FIG. 25(c). As a result, the green sheet 10 and the electrodes 11 and 12 are configured as defined by the shape of the outward curved portions 14a of the upper mold 14.

After the upper mold 14 is detached from the green sheet 10, or while the upper mold 14 is kept to be pressed, the green sheet 10 is then sintered at a temperature, e.g., 1200° C., which is sufficient to transform it into a ceramic. Advantageously, the piezoelectric vibrator unit is bonded to the spacer 22 by the process of sintering, without using adhesive.

A displacement of the vibrating plate, which ensues from the expansion and contraction of the vibrating plate, is easily converted into a deflection displacement which is made in conformity with a shape of the curved portion. Therefore, even if the piezoelectric vibrator unit is applied to an ink jet recording head of high density type in which it is required to reduce the volume of each pressure generating chamber, the vibrating plate can be deflected to such an extent as to discharge an ink droplet whose ink amount is required for the printing, by using a high drive voltage.

Figure 26:
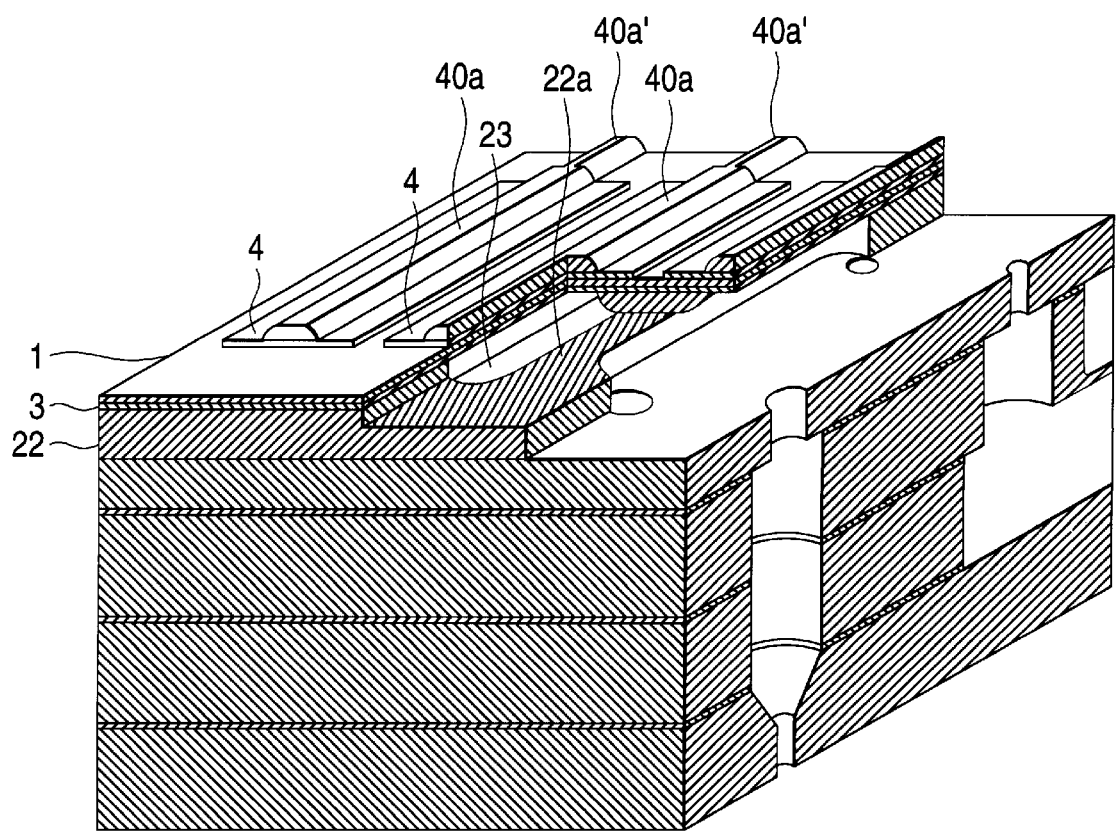
FIG. 26 is a parspective view showing a piezoelectric vibrator unit according to another embodiment of the present invention.
Figure 27:
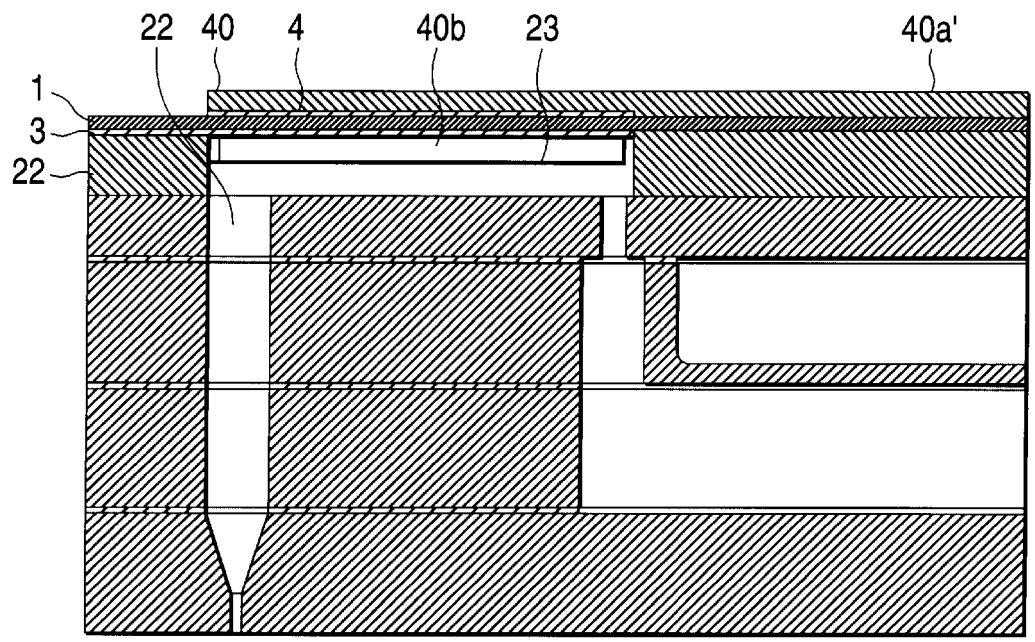
FIG. 27(a) is a lengthwise cross sectional view of the recording head in FIG. 26.
FIG. 27(b) is a widthwise cross sectional view of the recording head in FIG. 26.
Figure 27:
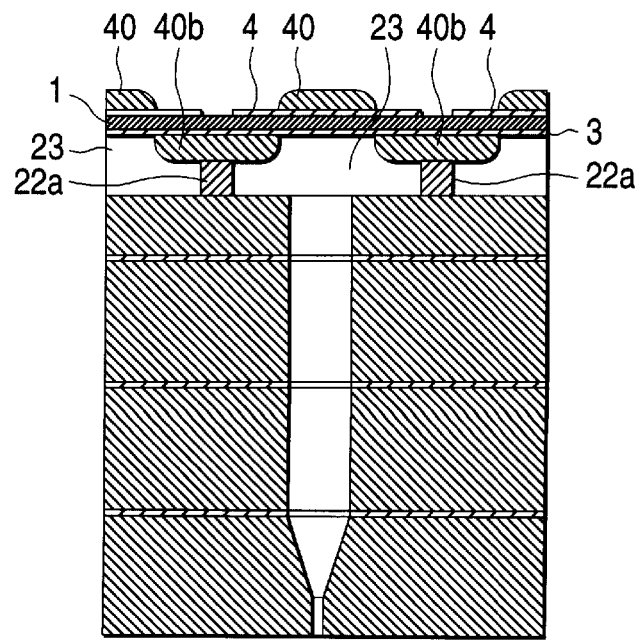

FIGS. 26, 27(a) and 27(b) show an ink jet recording head in which a piezolectric vibrator unit in accordance with another embodiment of the present invention is used. In this embodiment, no curved portions are formed in the elastically deformable plate. Further, not only one vibration inducing plate as shown in FIGS. 7(a)–8(b), but also first and second vibration inducing plates 40a and 40b are layered on the electrode 3 and 4. The first vibration inducing plates 40a are formed on the surface of the discrete electrodes 4 and the second vibration inducing plates 40b are formed on the surface of the common electrode 3. A lead-out electrode 40a', which is continuous to the first vibration inducing plates 40a, is extended to beyond the pressure generating chamber 23.

In the recording head thus constructed, a common electrode 4 is formed, by sputtering or vapor deposition, in a region of one of the major surfaces of a green sheet made of piezoelectric material, e.g., PZT, which will be formed into a vibrating plate by sintering, the region facing the pressure generating chambers 23. Then, second vibration inducing plates 40b are formed on the surface of the common electrode 4 in such that a gap is created in a region facing the pressure generating chambers 23, and the second vibration inducing plates 40b are respectively centered at the partitioning walls 22a of the spacer 22 partitioning the pressure generating chamber 23. In this case, thick-film plating, sputtering, a thick-film printing method, or the like may be used for forming the second vibration inducing plates 40b.

The structure formed in the above-mentioned process is bonded to one of the major surfaces of the spacer 22, and the covering member 26 is bonded to the other major surface of the spacer 22. In this state, the discrete electrodes 4 and the first vibration inducing plates 40a are not yet formed on the surface of the elastic plate 1. Therefore, it never happens that the elastic plate 1 subsides into the pressure generating chambers 23 and is deflected. Accordingly, pressure is applied to the elastic plate 1 uniformly over its entire surface, and the respective layers are reliably bonded together.

The structure is sintered to complete a semiproduct of a piezolectric vibrator unit not having the discrete electrodes 4 and the first vibration inducing plates 40a which will be formed on the upper surface of the elastic plate 1. Then, discrete electrodes 4 are formed on the surface of the semi-product so as to face the pressure generating chambers 23 by sputtering or vapor depositing conductive material. Metal is vapor deposited over the surface of the structure, and first vibration inducing plates 40a of ceramic are formed thereon by a thick-film printing method.

Figure 28:
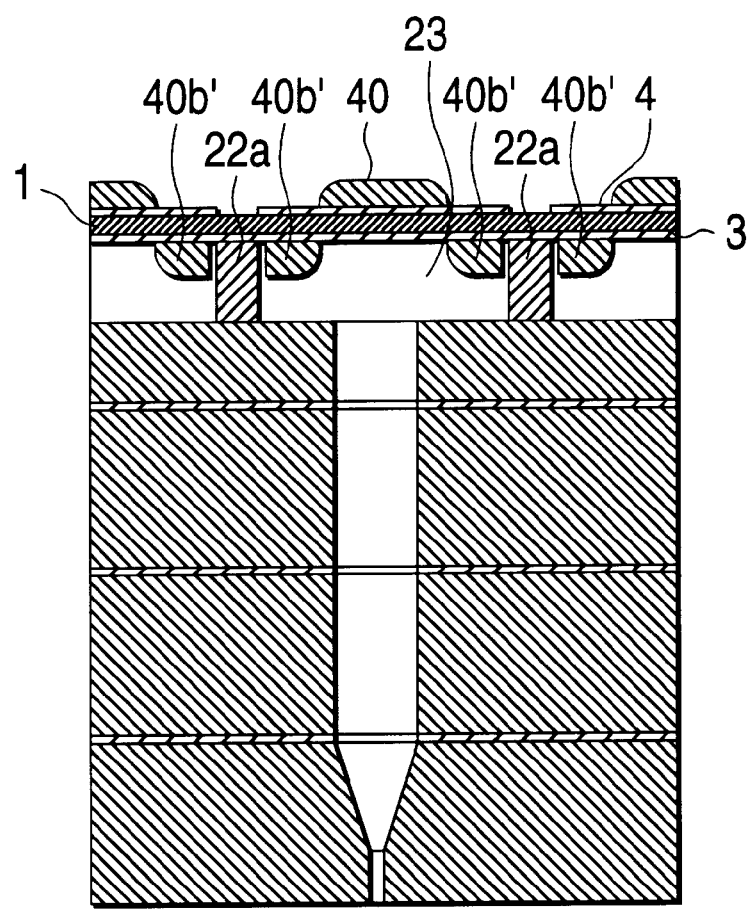
FIG. 28 is a cross sectional view of a piezoelectric vibrator unit according to another embodiment of the present invention.

FIG. 28 shows an ink jet recording head in which a piezoelectric vibrator unit similar to the embodiment in FIGS. 27(a) and 27(b) is used. In the embodiment in FIGS. 27(a) and 27(b), the second vibration inducing plate 40b is formed of a continuous body put on the related partitioning wall 22a of the spacer 22. However, in FIG. 28, the second vibration inducing plate 40b has two separate bodies 40b' and 40b'.

The embodiments described above are intended to be illustrative of the present invention. Accordingly, those skilled in the art will understand that additional examples could be produced which in no way depart from the scope of the present invention.

What is claimed is:

1. A layered type ink jet recording head comprising:
   at least one actuator unit and at least one ink supply unit coupled together;
   said actuator unit including:
      an elastic plate, made of piezoelectric material, having a first common electrode formed on a first side of said elastic plate and a at least one drive electrode formed in a deformable region on a second side of said elastic plate;
      a spacer having a first side which is directly sealingly covered by said elastic plate; and a second covering member which sealingly covers a second side of said spacer, said spacer having a hollow interior, said spacer along with said elastic plate and said second covering member, defining a pressure generating chamber, said drive electrode being disposed within said deformable region and above said pressure generating chamber, said second covering member including a first through hole which connects said pressure generating chamber to a first portion of said ink supply unit and a second through-hole which connects said pressure generating chamber to a second portion of said ink supply unit;
   wherein said first portion of said ink supply unit includes a common ink chamber and an ink supply port which connects said first through hole to said common ink chamber;
   wherein said second portion of said ink supply unit includes a discharge orifice and an ink discharge through-hole which connects said second through-hole to said discharge orifice of said second portion which receives ink from said pressure generating chamber in order to discharge an ink droplet, said ink originating in said common ink chamber; and
   wherein said deformable region of said elastic plate includes at least one curved portion which faces said pressure generating chamber.

2. The layered type ink jet recording head according to claim 1, wherein a magnitude of deflection of said curved portion of said elastic plate is selected to be one to two times as large as a thickness of said elastic plate.

3. The layered type ink jet recording head according to claim 2 further comprising a vibration inducing plate layered on an inwardly curved side of said curved portion of said elastic plate.

4. The layered type ink jet recording head according to claim 1, further comprising a second common electrode which is formed on a side of said elastic plate which is opposite to a side upon which said first common electrode is formed; wherein said drive electrode is buried in said curved portion of said elastic plate at a location which is within said deformable region.

5. The layered type ink jet recording head according to claim 4 further comprising a first filler placed on said curved portion of said elastic plate.

6. The layered type ink jet recording head according to claim 5 further comprising second fillers provided on a side of said curved portion, which is opposite to an inwardly curved side of said curved portion, in such a fashion that each of said second fillers is positioned on either side of said first filler.

7. The layered type ink jet recording head according to claim 1 further comprising a vibration inducing plate layered on an inwardly curved side of said curved portion of said elastic plate.

8. The layered type ink jet recording head according to claim 1 further comprising a first filler placed on said curved portion of said elastic plate.

9. The layered type ink jet recording head according to claim 8, further comprising second fillers provided on a side of said curved portion, which is opposite to an inwardly curved side of said curved portion, in such a fashion that each of said second fillers is positioned on either side of said first filler.

10. The ink jet recording head according to claim 1, wherein said spacer includes a conductive layer on a surface thereof to which said elastic plate is to be fixed, said elastic plate including an open area, in a region which is free from a vibration of said elastic plate, through which said conductive layer of said spacer is exposed and through which a signal is transmitted to said first common electrode of said elastic plate through said conductive layer.

11. The layer type ink jet recording head of claim 1, wherein said elastic plate is a ceramic plate.

12. A layered type ink jet recording head comprising:
    at least one actuator unit and at least one ink passage supply unit coupled together;
    said actuator unit including:
       a vibrating plate, made of piezoelectric material, having a first common electrode formed on a first side of said vibrating plate and at least one drive electrode formed in a deformable region on a second side of said vibrating plate;
       a spacer, having a first side which is sealingly covered by said vibrating plate; and
       a second covering member which directly sealingly covers a second side of said spacer, said spacer having a hollow interior, said spacer along with said vibrating plate and said second covering member, defining a pressure generating chamber, said drive electrode being disposed within said deformable region and above said pressure generating chamber, said second covering member including a first through-hole which connects a first portion of said ink supply unit to said pressure generating chamber and a second through-hole which connects said pressure generating chamber to a second portion of said ink supply unit;
    wherein, said first portion of said ink supply unit includes a common ink chamber and an ink supply port which connects said first through hole to said common ink chamber, said second portion of said ink supply unit including a discharge orifice and an ink supply through-hole which connects said second through hole to said discharge orifice of said second portion which receives ink from said pressure generating chamber in order to discharge an ink droplet, said ink originating in said common ink chamber; and wherein said actuator unit further comprises first and second vibration inducing plates each having a higher rigidity than said vibrating plate, said first vibration inducing plate being formed in a first region on a surface of said drive electrodes, said first vibration inducing plate facing said pressure generating chamber, said second vibration inducing plate being formed in a second region on a surface of said first common electrode.

13. The layered type ink jet recording head according to claim 12, wherein said first vibration inducing plate is made of conductive material, and wherein a first end of said first vibration inducing plate is outwardly extended beyond said pressure generating chamber.

14. The layered type ink jet recording head according to claim 12, wherein said second vibration inducing plate is made of conductive material.

15. The layered type ink jet recording head according to claim 14, wherein said second vibration inducing plate is made of metal.

16. The layered type ink jet recording head of claim 12, wherein said elastic plate is a ceramic plate.

17. A layered type ink jet recording head at least one actuator unit;

said actuator unit comprising:

an elastic plate, made of piezoelectric material, having at least on common electrode formed on a first side of said elastic plate and a plurality of drive electrodes, each formed in a respective deformable region on a second side of said elastic plate;

a spacer having a first side which is directly sealingly covered by said elastic plate;

said spacer having a plurality of hollow portions, said hollow portions of said spacer along with said elastic plate defining a plurality of pressure generating chambers, each of said plurality of drive electrodes being disposed within said respective deformable region and above one of said plurality of pressure generating chambers;

wherein said respective deformable region of said elastic plate includes at least one curved portion which faces each respective one of said plurality of pressure generating chambers; and wherein said elastic plate continuously covers said plurality of pressure generating chambers formed in said spacer.

18. The layer type ink jet recoding head of claim 17, wherein said elastic plate is a ceramic plate.

19. A layered type ink jet recording head having at least one actuator unit;

said actuator unit comprising:

an elastic plate, made of piezoelectric material, having a first common electrode formed on a first side of said elastic plate and at least one drive electrode formed in a deformable region on a second side of said elastic plate; said deformable region having at least one curved portion;

a spacer having a first side which is directly sealingly covered by said elastic plate; and a filler placed on each of said at least one curved portion of said elastic plate;

said spacer having a hollow interior, said spacer along with said elastic plate defining at least one pressure generating chamber, said drive electrode being disposed within said deformable region and above said at least one pressure generating chamber.

20. The layered type ink jet recording head according to claim 19 wherein second fillers are provided on a side of said curved portion in such a fashion that each of said second fillers is positioned on either side of said first filler.

* * * * *